(12) United States Patent
Hashimoto

(10) Patent No.: US 10,186,646 B2
(45) Date of Patent: Jan. 22, 2019

(54) METHOD FOR MANUFACTURING LIGHT-EMITTING DEVICE

(71) Applicant: NICHIA CORPORATION, Anan-shi, Tokushima (JP)

(72) Inventor: Toru Hashimoto, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 15/826,568

(22) Filed: Nov. 29, 2017

(65) Prior Publication Data

US 2018/0151785 A1 May 31, 2018

(30) Foreign Application Priority Data

Nov. 30, 2016 (JP) ................... 2016-233206

(51) Int. Cl.
*H01L 33/60* (2010.01)
*H01L 33/50* (2010.01)
*H01L 33/54* (2010.01)

(52) U.S. Cl.
CPC ............ *H01L 33/60* (2013.01); *H01L 33/502* (2013.01); *H01L 33/507* (2013.01); *H01L 33/508* (2013.01); *H01L 33/54* (2013.01); *H01L 2933/005* (2013.01); *H01L 2933/0033* (2013.01); *H01L 2933/0041* (2013.01); *H01L 2933/0058* (2013.01); *H01L 2933/0091* (2013.01)

(58) Field of Classification Search
CPC ....... H01L 33/60; H01L 33/54; H01L 33/502; H01L 33/507; H01L 33/508; H01L 2933/0041; H01L 2933/0033; H01L 2933/0091; H01L 2933/005; H01L 2933/0058

See application file for complete search history.

(56) References Cited

U.S. PATENT DOCUMENTS

| 2013/0037842 A1* | 2/2013 | Yamada | ............... H01L 33/60 257/98 |
| 2013/0240922 A1* | 9/2013 | Yamamoto | .......... H01L 25/0753 257/89 |

(Continued)

FOREIGN PATENT DOCUMENTS

| JP | 2001-111119 A | 4/2001 |
| JP | 2013-140894 A | 7/2013 |

(Continued)

*Primary Examiner* — Karen Kasumakar
(74) *Attorney, Agent, or Firm* — Foley & Lardner LLP

(57) ABSTRACT

A method for manufacturing at last one light-emitting device including a light-transmissive member, a light-emitting element, and a reflective member, the method including: providing a holding member comprising a plurality of through-holes or recesses; disposing a light-transmissive member in at least one of the through-holes or at least one of the recesses; disposing a light-emitting element on the light-transmissive member in the at least one through-hole or the at least one recess; forming a reflective member in contact with a lateral surface defining the at least one through-hole or the at least one recess and covering a lateral surface of the light-emitting element; and removing the at least one light-emitting device from the holding member.

20 Claims, 21 Drawing Sheets

(56) References Cited

U.S. PATENT DOCUMENTS

2015/0228872 A1* 8/2015 Nagano ............... H01L 25/167
                                                    257/98
2016/0133809 A1   5/2016 Kuramoto
2016/0351760 A1  12/2016 Hayashi et al.

FOREIGN PATENT DOCUMENTS

| | | |
|---|---|---|
| JP | 2013-251417 A | 12/2013 |
| JP | 2014-110333 A | 6/2014 |
| JP | 2016-066765 A | 4/2016 |
| JP | 2016-092276 A | 5/2016 |
| JP | 2016-119402 A | 6/2016 |
| JP | 2016-533030 A | 10/2016 |
| JP | 2016-197760 A | 11/2016 |
| JP | 2016-225596 A | 12/2016 |
| WO | WO-2015-013399 A1 | 1/2015 |

* cited by examiner

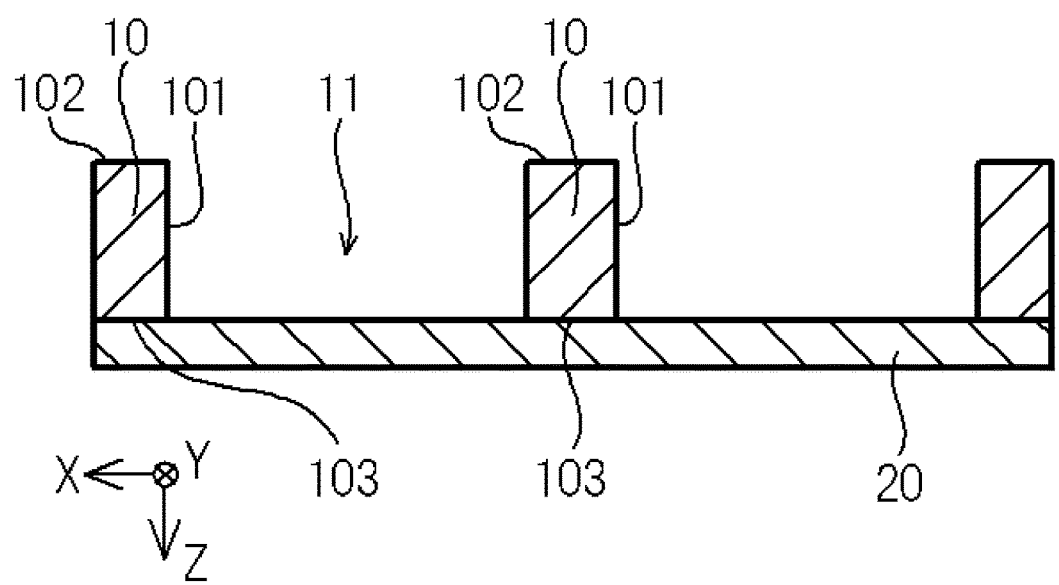

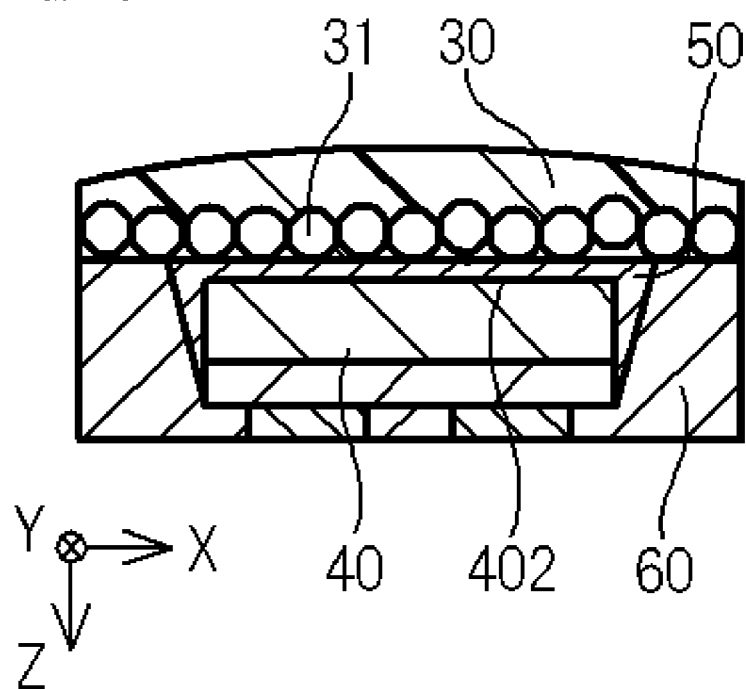

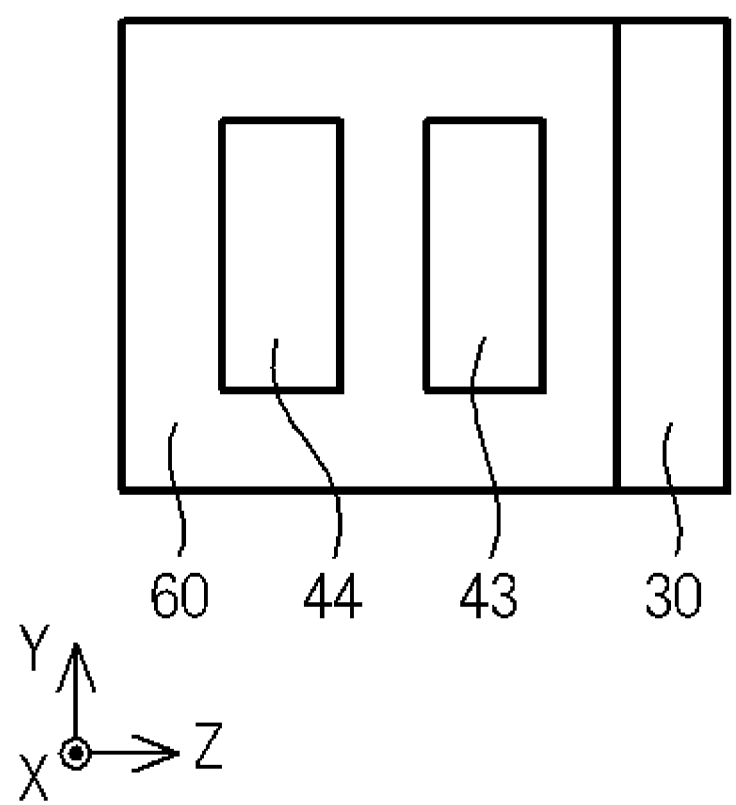

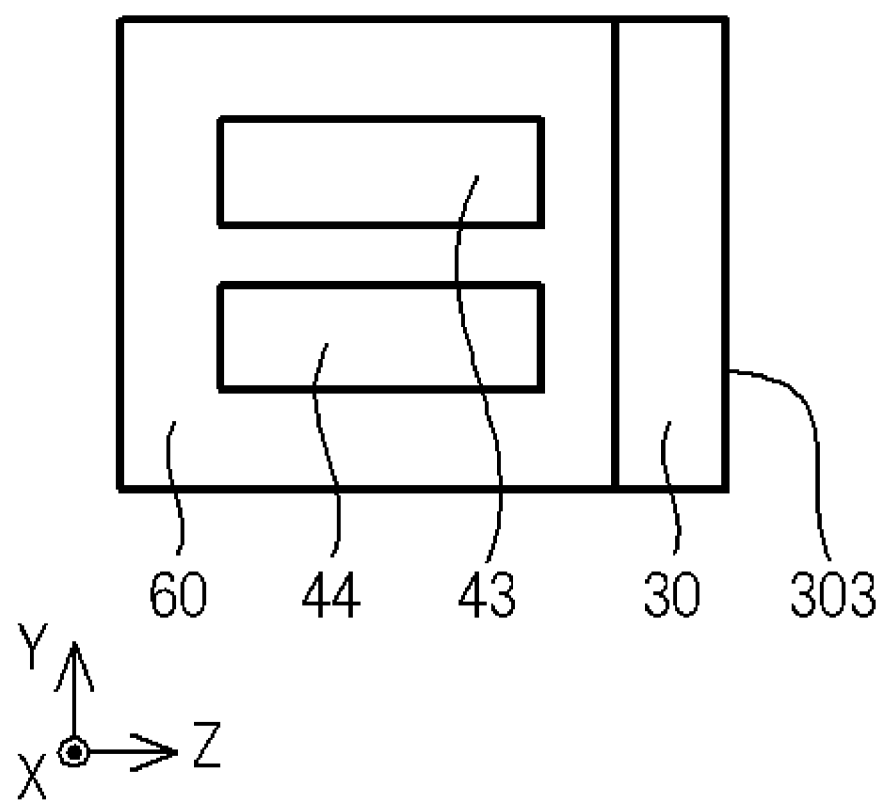

METHOD FOR MANUFACTURING LIGHT-EMITTING DEVICE

CROSS-REFERENCE TO RELATED APPLICATION

This application claims priority to Japanese Patent Application No. 2016-233206, filed on Nov. 30, 2016, the disclosure of which is hereby incorporated by reference in its entirety.

BACKGROUND

The present disclosure relates to a method for manufacturing light-emitting devices.

LED packages have been known that provide white light by mixing light emitted from LED chips with light subjected to wavelength conversion by phosphors excited by the light emitted from the LED chips. Japanese Unexamined Patent Application Publication No. 2016-119402 discloses light-emitting devices each of which includes an LED chip, a phosphor plate disposed on the upper surface of the LED chip, and a resin covering the lateral surfaces of the LED chip.

The light-emitting devices proposed in Japanese Unexamined Patent Application Publication No. 2016-119402 are separated by cutting the resin and/or the phosphor plate according to an intended external shape of the light-emitting devices. Separation of the light-emitting devices necessitates cutting of a plurality of portions according to the intended external shape of the light-emitting devices. Hence, even one deviation in cutting position leads to unevenness in the shape of the light-emitting devices and may reduce the yield.

One object of certain embodiments of the present disclosure is to provide a method for manufacturing a light-emitting device that offers an improved yield.

SUMMARY

In one embodiment, a method is provided for manufacturing light-emitting devices, each including a light-transmissive member, a light-emitting element, and a reflective member. The method comprises: providing a holding member in which through-holes or recesses are defined; disposing the light-transmissive member in each of the through-holes or the recesses; disposing the light-emitting element on each of the light-transmissive members in the through-hole or the recess; forming the reflective member that is in contact with lateral surfaces of each of the through-holes or the recesses and covers lateral surfaces of the light-emitting element; and removing the light-emitting devices from the holding member.

A method for manufacturing light-emitting devices according to certain embodiments of the present disclosure offers an improved yield.

BRIEF DESCRIPTION OF THE DRAWINGS

FIG. 1B is a schematic end view along the line A-A in FIG. 1A.

FIG. 14C is a schematic sectional view of another modification of the light-emitting device according to the third embodiment.

FIG. 17B is a schematic bottom view of the light-emitting device according to the fourth embodiment.

FIG. 17C is a schematic bottom view of a modification of the light-emitting device according to the fourth embodiment.

DETAILED DESCRIPTION

Figure 1A:
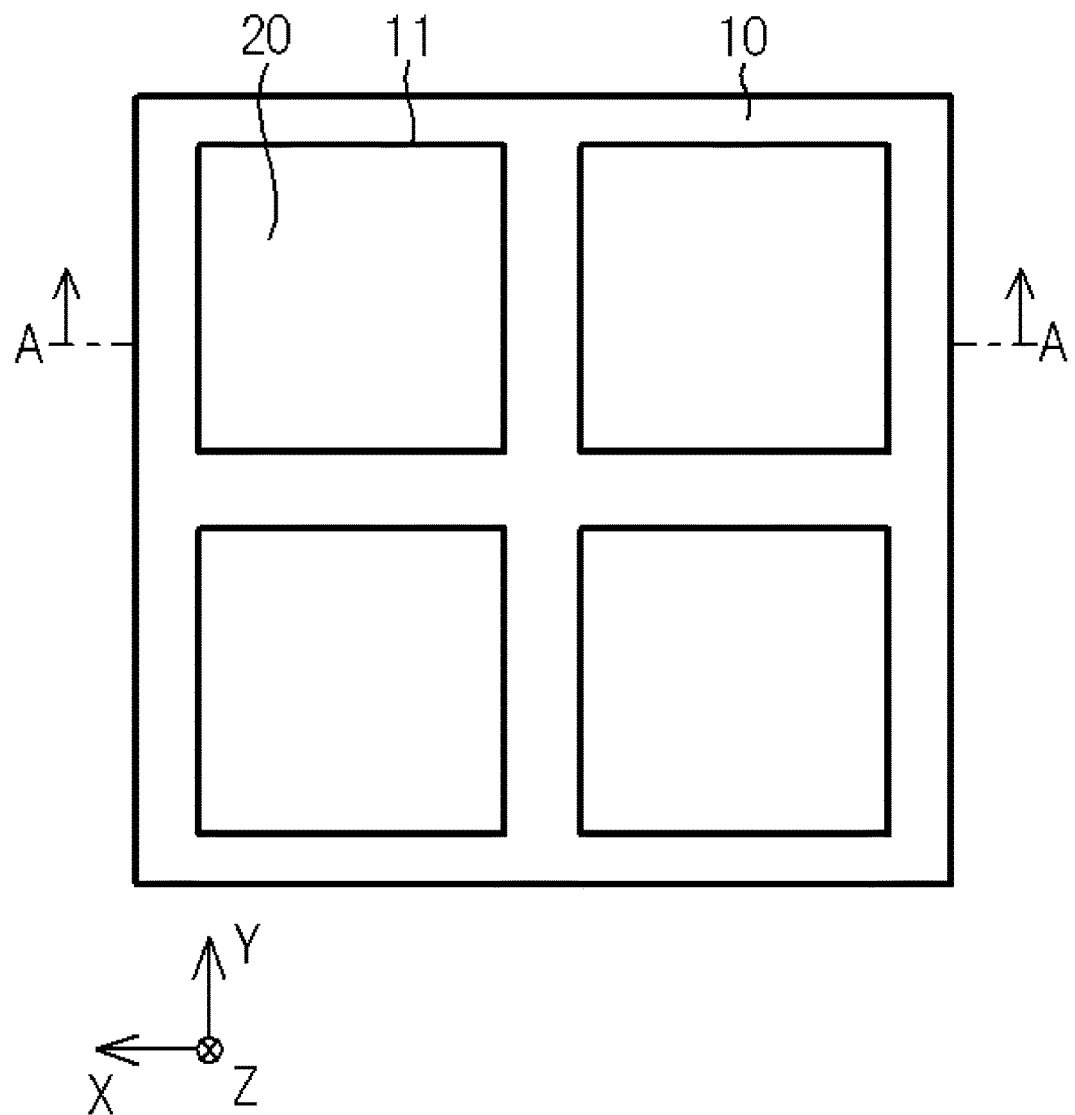
FIG. 1A is a schematic top view for illustrating providing of a holding member according to a first embodiment.

Embodiments are described below with reference to the accompanying drawings as appropriate. The methods for manufacturing light-emitting devices described below are intended to embody the technical concept of the present disclosure. The present invention is not limited to the specific methods described below unless specifically stated otherwise. Constitutions described with respect to one embodiment are applicable to other embodiments.

Furthermore, in the descriptions below, the same term or reference numeral represents the same member or a member made of the same material, and its detailed description will be omitted as appropriate. As for each of the elements that constitute the present invention, a plurality of elements may be formed of one member so that the member serves as the plurality of elements, or conversely, a combination of a plurality of members may fulfill the function of one member.

First Embodiment

A method for manufacturing light-emitting devices according to a first embodiment will be described referring to FIG. 1A to FIG. 7B.

In the first embodiment, a method is provided for manufacturing light-emitting devices, each including a light-transmissive member, a light-emitting element, and a reflective member. The method comprises: providing a holding member in which through-holes or recesses are defined; disposing the light-transmissive member in each of the through-holes or the recesses; disposing the light-emitting element on each of the light-transmissive members in the through-hole or the recess; forming the reflective member that is in contact with lateral surfaces defining each of the through-holes or the recesses and covers lateral surfaces of the light-emitting element; and removing the light-emitting devices from the holding member.

Each step is described in detail below.
Step 1-1. Providing Holding Member

A holding member 10 in which through-holes 11 are defined is provided as shown in FIG. 1A and FIG. 1B. The through-holes 11 penetrate through the holding member 10 from an upper surface 102 to a lower surface 103. Preferably, lateral surfaces 101 defining the through-holes 11 between the upper surface 102 and the lower surface 103 of the holding member 10 are substantially flat. The substantially flat lateral surfaces 101 defining the through-holes 11 facilitate removing the light-emitting devices described later from the holding member. In the present specification, the term "substantially flat" means that there are no surface roughness or very little surface roughness and that surface roughness measuring 5 µm or less are acceptable.

Figure 2:
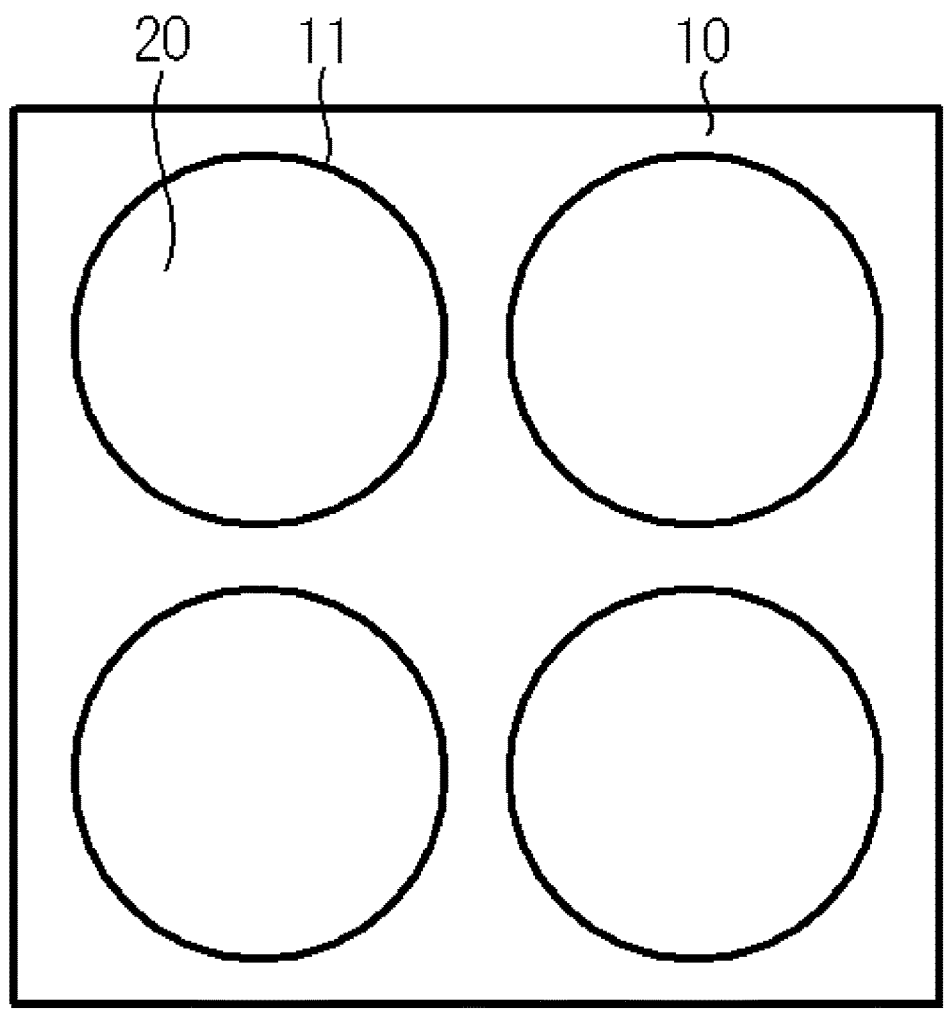
FIG. 2 is a schematic top view of a modification of the holding member.

As shown in FIG. 1A, examples of the shape of each through-hole 11 in a top view include not only polygons formed of straight lines, such as quadrilaterals, pentagons, and hexagons, but also circular shapes formed of curved lines as shown in FIG. 2. The shape of the through-hole in a top view may be defined by both of straight lines and curved lines. With a through-hole with rounded corners in a top view, the light-transmissive member and/or the reflective member described later can be readily filled into every corner of the through-hole.

Methods known in the art may be used to form the through-holes in the holding member, such as laser irradiation, punching, etching, and sand blasting. Alternatively, the holding member in which the through-holes are defined may be formed by compression molding, transfer molding, or injection molding, using a mold. With the holding member 10 formed with a mold, unevenness in the shape of the through-holes can be reduced. In addition, a known method, such as polishing, may be employed to make the lateral surfaces of the through-holes substantially flat.

The openings of the through-holes 11 can be closed by attaching a supporting member 20 made of a heat-resistant sheet or the like to the lower surface 103 of the holding member 10 as shown in FIG. 1B. Preferably, the lower surface of the holding member 10 and the upper surface of the supporting member 20 are substantially flat. This structure reduces gaps between the supporting member 20 and the holding member 10. Accordingly, the reflective member described later in the gaps between the supporting member and the holding member is thus less likely to be formed, thereby enabling reduction in unevenness of the shape of the light-emitting devices.

The holding member may have recesses instead of the through-holes. Preferably, the lateral surfaces defining the recesses are also substantially flat. The substantially flat lateral surfaces defining the recesses facilitate removing the light-emitting devices described later from the holding member. The bottom surfaces of the recesses may be substantially flat or rough surface.

Step 1-2. Disposing Light-Transmissive Member

Figure 3A:
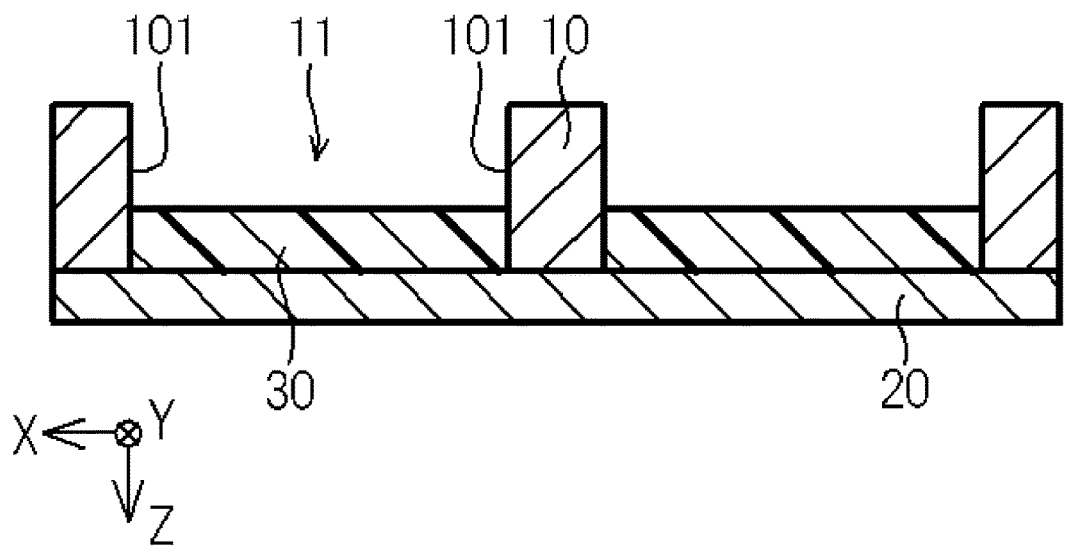
FIG. 3A is a schematic sectional view for illustrating disposing of a light-transmissive member according to the first embodiment.

A light-transmissive body is filled into each through-hole 11 and then cured, so that light-transmissive members 30 are disposed in the through-holes 11 as shown in FIG. 3A. In the present specification, the light-transmissive members before being cured may be called the light-transmissive body. Methods known in the art may be used to supply the light-transmissive body. Examples of the methods include printing and potting. The light-transmissive members in contact with the lateral surfaces defining the through-holes are readily formed by filling the light-transmissive body into the through-holes. The light-transmissive members are each in contact with the lateral surfaces defining the through-holes, and therefore, the light-transmissive members constitute part of the outer lateral surfaces of the light-emitting devices described later. This structure realizes the light-emitting devices providing broader light distribution than a structure that the reflective members constitute the outer lateral surfaces of the light-emitting devices.

Figure 3B:
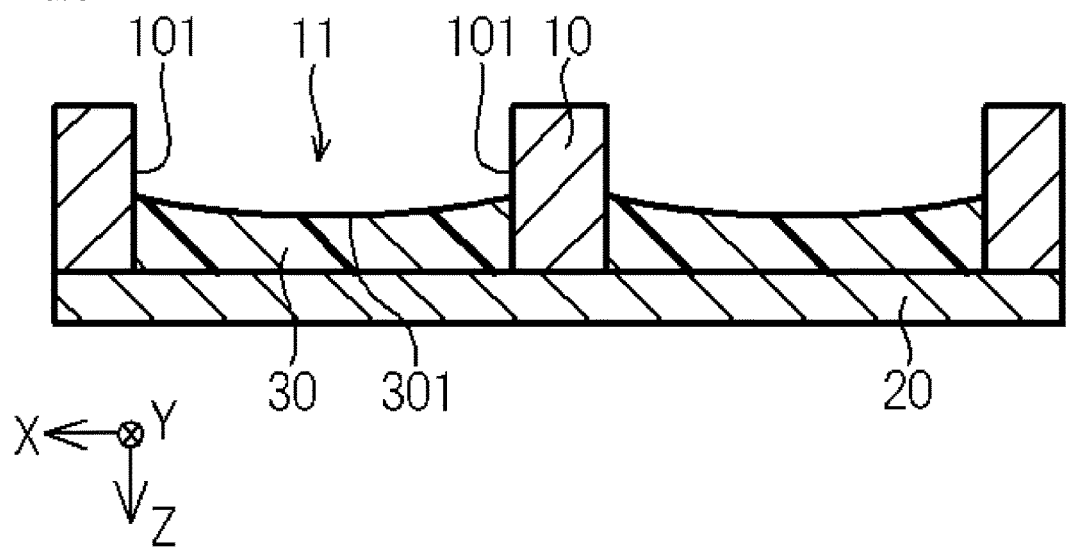
FIG. 3B is a schematic sectional view for illustrating a modification of the disposing of a light-transmissive member according to the first embodiment.
Figure 3C:
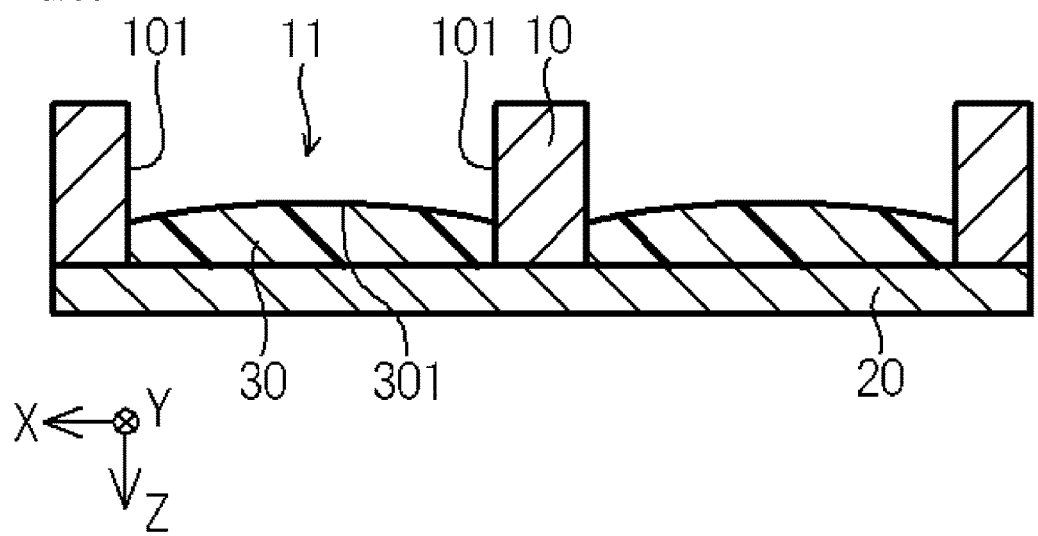
FIG. 3C is a schematic sectional view for illustrating another modification of the disposing of a light-transmissive member according to the first embodiment.

Adjusting the wettability between the light-transmissive body and the holding member can form the upper surface of each of the light-transmissive members into a concave or convex shape. For example, in the case where the light-transmissive body has a good wettability with respect to the holding member, an upper surface 301 of each of the light-transmissive members 30 can be formed into a curved concave shape as shown in FIG. 3B. Forming the upper surface 301 of each of the light-transmissive members 30 into a curved concave shape makes it harder for a bonding member described later to spread over the upper surface of each of the light-transmissive members. This structure reduces unevenness in the shape of the bonding member. In the case where the light-transmissive body has a bad wettability with respect to the holding member, the upper surface 301 of each of the light-transmissive member 30 can be formed into a curved convex shape as shown in FIG. 3C. The statement that the wettability between the light-transmissive body and the holding member is good or bad is made in comparison with the wettability between the light-transmissive body and the holding member when the upper surface of each of the light-transmissive member is flat as shown in FIG. 3A.

The light-transmissive member may contain wavelength conversion members and/or light-diffusing members. The wavelength conversion members convert light having a first peak wavelength emitted from the light-emitting elements described later into light having a second peak wavelength different from the first peak wavelength. A combination of a blue or ultraviolet light-emitting element and the wavelength conversion members enables production of a light-emitting device that emits, for example, white light. The light-diffusing members diffuse light emitted from the light-emitting element described later. Incorporating the light-diffusing members in the light-transmissive member reduces non-uniformity in color and luminance within the light-transmissive member. The wavelength conversion members and/or the light-diffusing members may be unevenly distributed or dispersed in the light-transmissive member.

In the case of the holding member in which recesses are defined, the light-transmissive member is positioned in each recess.

Step 1-3. Disposing Light-Emitting Element

Figure 4:
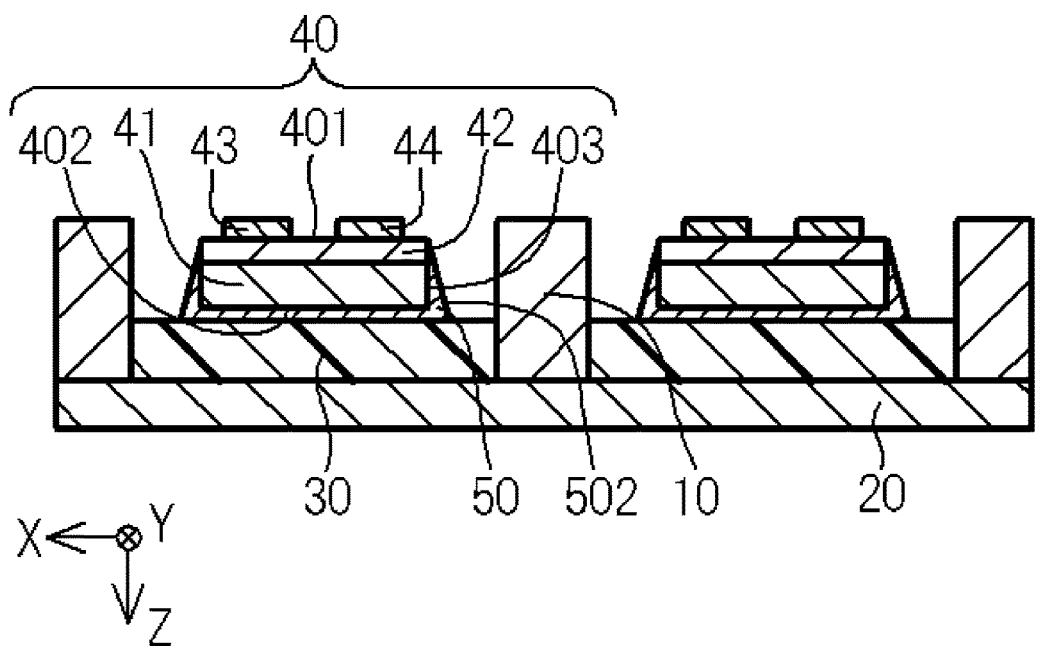
FIG. 4 is a schematic sectional view for illustrating disposing of a light-emitting element according to the first embodiment.

A light-emitting element 40 is disposed on the light-transmissive member 30 in each through-hole as shown in FIG. 4. The light-emitting element 40 is disposed on the light-transmissive member 30 preferably with a bonding member 50 therebetween. Bonding the light-emitting element 40 to the light-transmissive member 30 with the bonding member 50 can discourage or prevent misalignment between the light-transmissive member 30 and the light-emitting element 40 when the reflective member described later is formed. The light-emitting element is disposed preferably at the substantial center of the light-transmissive member in a top view. Unevenness in the width (i.e., X direction) of the reflective member covering the lateral surfaces of the light-emitting element is reduced when the reflective member described later is formed. This structure can mitigate transmission of light emitted from the light-emitting element through thin portions in the width (i.e., X direction) of the reflective member. A plurality of light-emitting elements may be disposed on one light-transmissive member. The light-emitting element 40 includes a semiconductor layered body 42 on a light-transmissive substrate 41, such as a sapphire substrate, and a pair of electrodes 43 and 44 on the upper surface of the semiconductor layered body. The light-emitting element 40 has an electrode formation surface 401, a light-emitting surface 402 opposite to the electrode formation surface, and lateral surfaces 403 between the electrode formation surface 401 and the light-emitting surface 402. The pair of electrodes 43 and 44 are formed on the electrode formation surface 401. The shape of the pair of electrodes 43 and 44 can be independently determined. In the light-emitting device in the present embodiment, the electrode formation surface 401 is the upper surface of the semiconductor layered body 42, and the light-emitting surface 402 is the lower surface of the light-transmissive substrate 41.

The light-emitting element is disposed on the light-transmissive member such that the light-emitting surface 402 of the light-emitting element 40 faces the light-transmissive member 30. In other words, the pair of electrodes 43 and 44 are formed on the surface of the light-emitting element 40 opposite to the surface facing the light-transmissive member 30. The bonding member 50 may cover part of the light-emitting element from the light-emitting surface 402 to the lateral surfaces 403 of the light-emitting element. It is preferable that the bonding member 50 be in contact with and cover the lateral surfaces 403 of the light-emitting element, because this structure improves the adhesive strength between the light-emitting element and the light-transmissive member. The bonding member 50 has a higher transmittance for light emitted from the light-emitting element than the transmittance of the reflective member described later. Hence, the bonding member 50 preferably covers the lateral surfaces of the light-transmissive substrate 41 and the semiconductor layered body 42. Outer surfaces 502 of the bonding member 50 are preferably inclined outward from the electrode formation surface 401 toward the light-emitting surface 402 of the light-emitting element 40. This structure makes it easy for light emitted from the light-emitting element 40 to exit from the light-emitting element 40 through the bonding member 50.

Step 1-4. Forming Reflective Member

Figure 5:
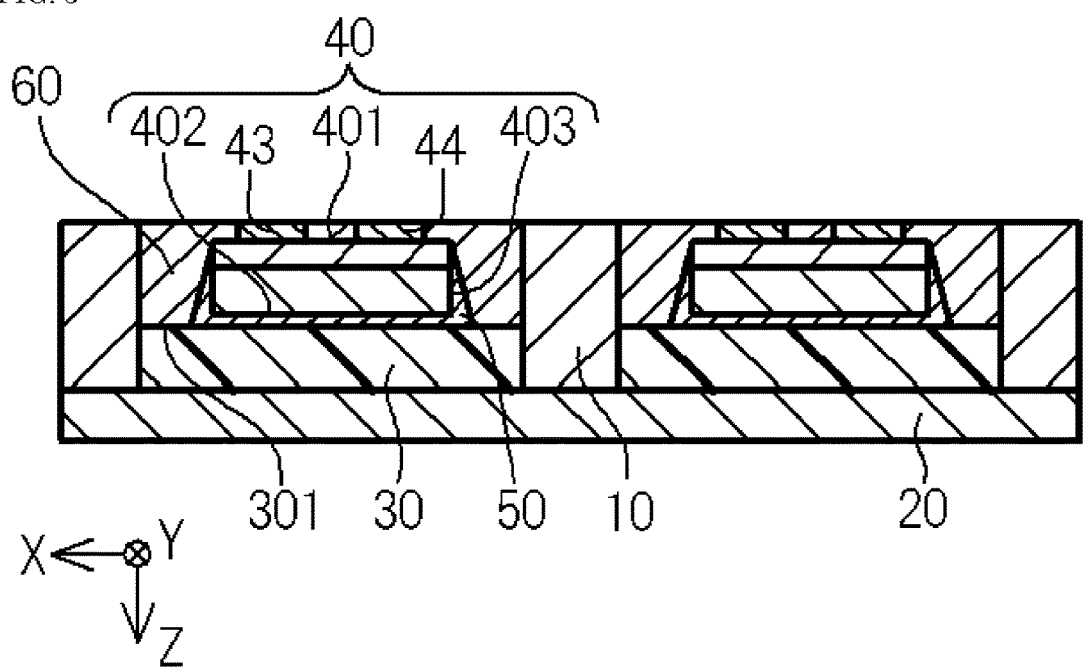
FIG. 5 is a schematic sectional view for illustrating forming of a reflective member according to the first embodiment.

A reflective member 60 is formed to cover the lateral surfaces 403 of the light-emitting element 40 as shown in FIG. 5. The reflective member 60 may also cover the upper surface 301 of the light-transmissive member 30. The upper surface 301 of the light-transmissive member 30 here is the surface of the light-transmissive member 30 facing the light-emitting surface 402 of the light-emitting element 40. In the case where the bonding member 50 bonds the light-emitting element 40 to the light-transmissive member 30, the reflective member 60 may be in contact with the bonding member 50 and cover the lateral surfaces 403 of the light-emitting element 40. In the case where the bonding member 50 covers the lateral surfaces 403 of the light-emitting element, the reflective member 60 may cover the lateral surfaces 403 of the light-emitting element 40 with the bonding member 50 therebetween.

The reflective member 60 may cover the portion without the electrodes 43 and 44 on the electrode formation surface 401 of the light-emitting element 40. In this case, the thickness (dimension in the direction) of the reflective member 60 may be adjusted such that at least a part of each of the electrodes 43 and 44 is exposed from the reflective member 60. Alternatively, it is possible that the reflective member 60 having a thickness large enough to embed the electrodes 43 and 44 is formed and then partially removed to expose the electrodes 43 and 44. To remove the reflective member 60, methods known in the art may be used, such as etching, cutting, grinding, polishing, and sand blasting.

Step 1-5. Removing Light-Emitting Device

Figure 6:
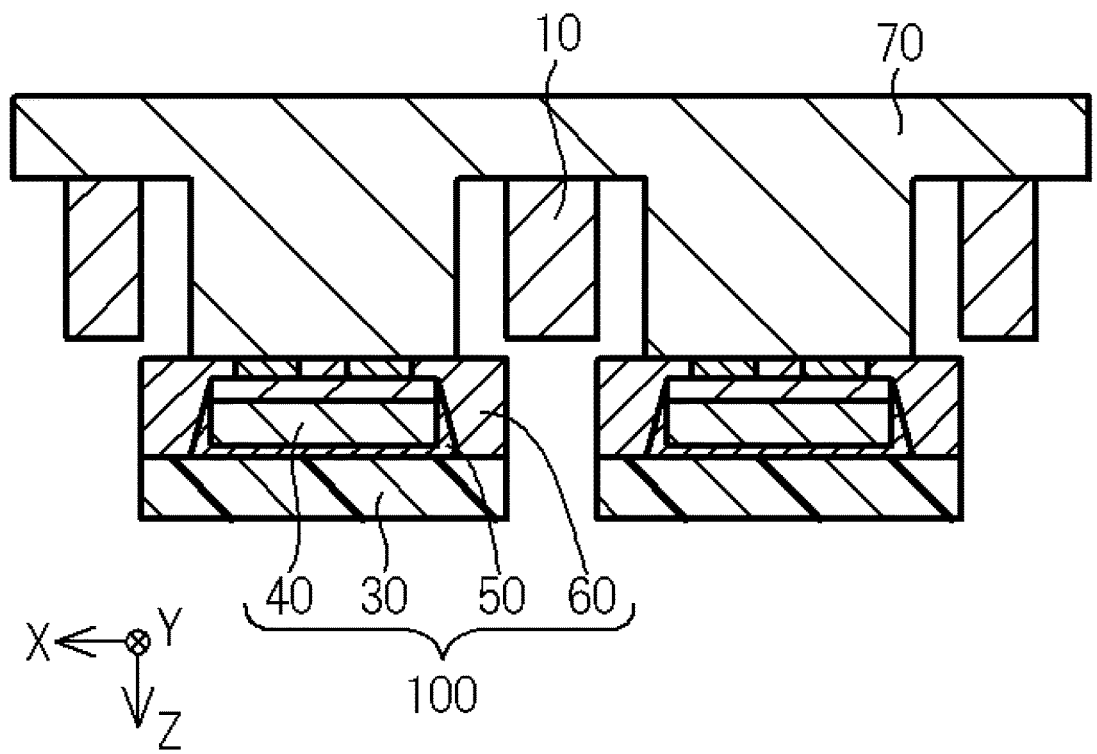
FIG. 6 is a schematic sectional view for illustrating removing light-emitting devices according to the first embodiment.

The light-emitting devices 100 each including the light-transmissive member 30, the light-emitting element 40, and the reflective member 60 are removed from the through-holes of the holding member as shown in FIG. 6. In the case where the bonding member 50 bonds the light-emitting element 40 to the light-transmissive member 30, each of the light-emitting devices 100 also includes the bonding member 50. The light-emitting devices may be removed from the holding member by, for example, pushing the light-emitting devices, dissolving the holding member, or applying a centrifugal force to the light-emitting devices. It is particularly preferable to push the light-emitting devices 100 with a pressing member 70 to remove it from the holding member 10 as shown in FIG. 6. In the case where the light-emitting devices 100 are removed from the holding member 10 by pushing, the light-emitting devices 100 may be removed from the holding member 10 by pushing the light-emitting devices 100 downward with the pressing member 70 after the holding member 10 is secured, or the light-emitting devices 100 may be removed from the holding member 10 by moving the holding member 10 upward after the light-emitting devices 100 are held by pushing the light-emitting devices 100 with the pressing member 70.

The supporting member 20 may be removed from the light-emitting devices after the light-emitting devices 100 are removed from the holding member 10. Alternatively, the supporting member 20 may be removed from the light-emitting devices 100 before removing the light-emitting devices form the holding member 10. In the case where the light-emitting devices 100 are removed from the holding member by pushing the light emitting devices 100, the supporting member 20 is removed from the holding member 10 before removing the light-emitting devices 100 from the through-hole of the holding member.

In the case where the light-transmissive members 30 and the reflective members 60 are formed with resin materials, the hardness of the reflective members is preferably higher than the hardness of the light-transmissive members. This structure can inhibit or prevent deformation of the reflective member 60 when the reflective members 60 are pushed to remove the light-emitting devices 100 from the holding member 10. The hardness of the reflective members and the light-transmissive members can be measured in accordance with JIS K 6253-3:2012.

In the case where the light-emitting devices 100 are removed from the holding member 10 by pushing the light-emitting devices 100, it is preferable that a plurality of light-emitting devices 100 be pushed at the same time. This method shortens the time required for the removing compared with the case where the light-emitting devices 100 are pushed one by one.

In the case of the holding member in which recesses are defined, the light-emitting devices can be removed from the holding member by dissolving the holding member or applying a centrifugal force to the light-emitting devices. Alternatively, the bottom of the recess of the holding member may be removed. This removal provides the light-transmissive members respectively formed in the through-holes of the holding member, and the light-emitting devices may be removed from the holding member by pushing the light-transmissive members in a similar manner to the above-described manner.

The light-emitting devices 100 each including the light-transmissive member, the light-emitting element, and the reflective member are obtained through the above-mentioned steps. In the method for manufacturing light-emitting devices in the present embodiment, individual light-emitting devices are manufactured in each through-hole or recess of the holding member, such that the each shape of the light-emitting devices in a top view is substantially the same as or similar to the each shape of the through-hole or recess. Accordingly, unevenness in the shape of the light-emitting devices fan be reduced compared with the case where the light-emitting devices are separated by cutting, thereby enabling improvement of the manufacturing yield of the light-emitting devices.

In the case where the light-transmissive member containing wavelength conversion members is cut as in a conventional method, the wavelength conversion members may protrude from a surface of the light-transmissive member depending on the hardness of the wavelength conversion members. This protrusion may lead unevenness in the shape of the light-transmissive member. The light-transmissive member is not cut in the method for manufacturing light-emitting devices in the present embodiment, thereby enabling reduction in unevenness of the shape of the light-transmissive members. Also, a protective film may be formed on the surface of the wavelength conversion members for the purpose of protection against moisture and the like. Separation by cutting the light-transmissive member as in a conventional method may remove the protective film of the wavelength conversion members. In the method for manufacturing light-emitting devices in the present embodiment, the light-transmissive member is not cut, thereby discouraging or preventing removal of the protective film of the wavelength conversion members.

Figure 7A:
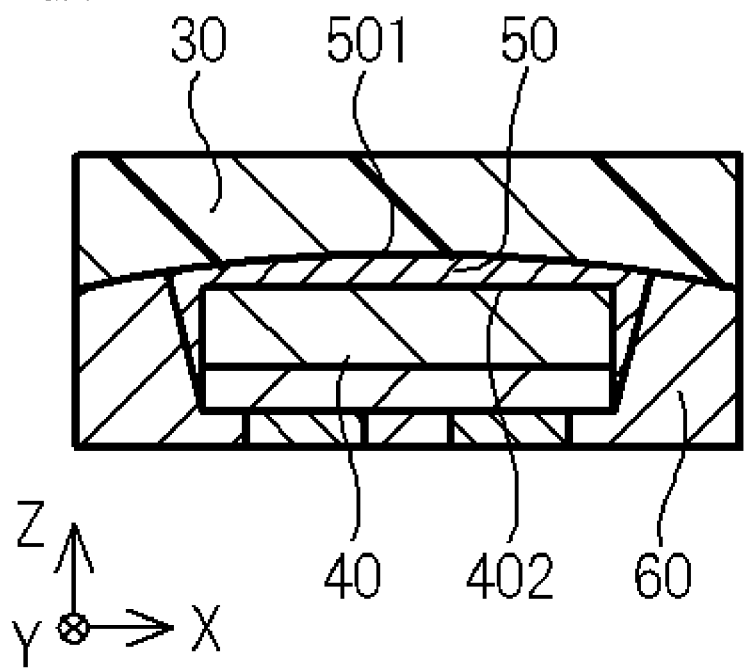
FIG. 7A is a schematic sectional view of a modification of the light-emitting device according to the first embodiment.

In the case where the above-mentioned manufacturing process of a light-emitting device is performed using the light-transmissive member shown in FIG. 3B, the surface of the light-transmissive member 30 facing the light-emitting surface 402 of the light-emitting element 40 has a curved concave shape as shown in FIG. 7A. This structure makes a surface 501 of the bonding member facing the light-transmissive member 30 have a curved convex shape. Therefore, light emitted from the light-emitting element 40 is less likely to be reflected when entering the light-transmissive member 30 than in the case where the surface of the bonding member facing the light-transmissive member 30 is flat, thereby increasing the light extraction efficiency of the light-emitting device 100.

Figure 7B:
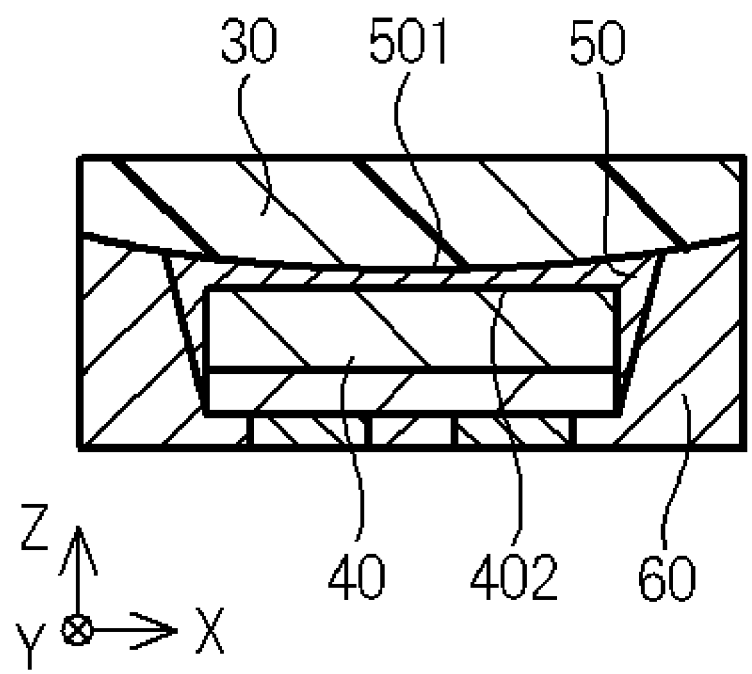
FIG. 7B is a schematic sectional view of another modification of the light-emitting device according to the first embodiment.

In the case where the above-mentioned manufacturing process of light-emitting devices is performed using the light-transmissive member shown in FIG. 3C, the surface of the light-transmissive member 30 facing the light-emitting surface 402 of the light-emitting element 40 has a curved convex shape as shown in FIG. 7B. This structure makes the surface 501 of the bonding member facing the light-transmissive member 30 have a curved concave shape. Therefore, it allows light emitted from the light-emitting element 40 to be more readily reflected when entering the light-transmissive member 30 than in the case where the surface of the bonding member facing the light-transmissive member 30 is flat, thereby facilitating diffusion of the light emitted from the light-emitting element within the bonding member 50. This diffusion reduces non-uniform luminance within the bonding member 50.

Second Embodiment

A manufacturing process of light-emitting devices according to a second embodiment will be described referring to FIG. 8 to FIG. 10B. The manufacturing process of the light-emitting devices according to the second embodiment differs from the manufacturing process of the light-emitting devices according to the first embodiment in that the light-transmissive members are disposed away from the holding member.

Step 2-1. Providing Holding Member

The holding member in which through-holes or recesses are defined similarly to the method for manufacturing the light-emitting devices 100 according to the first embodiment.

Step 2-2. Disposing Light-Transmissive Member

Figure 8:
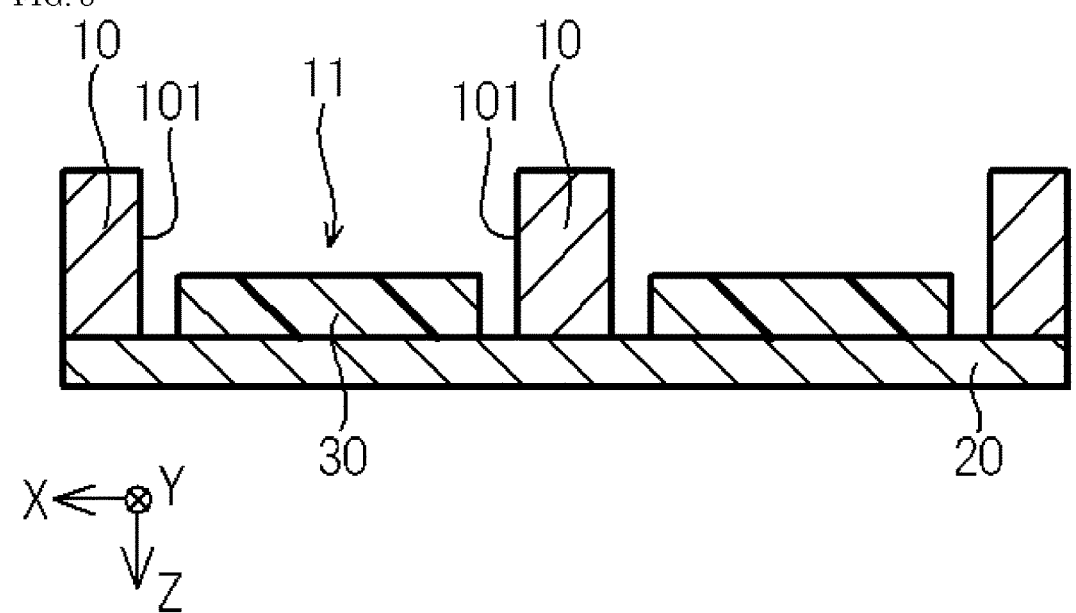
FIG. 8 is a schematic end view for illustrating disposing of a light-transmissive member according to a second embodiment.

In the through-holes 11 as shown in FIG. 8, light-transmissive member 30 are disposed away from the lateral surfaces 101 that define respective through-holes 11 of the holding member 10. The light-transmissive members 30 are positioned away from the lateral surfaces 101 of respective the through-holes 11 because the light-transmissive members each have an area smaller than that of each of the through-holes in a top view. For the light-transmissive members 30 to be easily positioned away from the lateral surfaces 101 defining the through-holes 11, the light-transmissive members 30 that each have already been cured can be used. The light-transmissive members preferably each have the area larger than that of each of the light-emitting elements in a top view. This structure facilitates disposing of the light-emitting elements on the light-transmissive members, respectively.

Example shapes of the light-transmissive members in a top view include not only polygons formed of straight lines, such as quadrilaterals, pentagons, and hexagons, but also circular shapes formed of curved lines. The shape of the individual light-transmissive members in a top view may be formed of both of straight lines and curved lines.

The light-transmissive members are respectively disposed preferably at the substantial centers of the through-holes in a top view. When the reflective member is formed on the lateral surfaces of the light-transmissive member, unevenness in the width (i.e., X direction) of the reflective member covering the lateral surfaces of the light-transmissive member is thus reduced. This structure can discourage or prevent leakage of light emitted from the light-emitting element through thin portions in the width (i.e., X direction) of the reflective member.

In the case where the light-transmissive members each contain one or more of the wavelength conversion members, the wavelength conversion members may be unevenly distributed in the light-transmissive member. Preferably, the wavelength conversion members are localized to the surface facing the light-emitting element within the light-transmissive member. In the case where a substance that is vulnerable to moisture is used as the wavelength conversion members, disposing the wavelength conversion members closer to the surface facing the light-emitting element makes a portion of the light-transmissive member with a smaller amount of wavelength conversion members serve as a protective layer. This structure can discourage deterioration of the wavelength conversion members and maintains good chromaticity. Examples of a phosphor that is vulnerable to moisture include KSF phosphors.

When the light-transmissive body is disposed in the through-holes, the light-transmissive members can be respectively positioned away from the lateral surfaces defining the through-holes by adjusting the amount and/or viscosity of the light-transmissive body. The light-transmissive body is disposed preferably at the substantial centers of the through-holes. This structure can discourage or prevent the light-transmissive body from being in contact with the lateral surfaces of the respective through-holes even when the light-transmissive body spreads. In the case of the holding member 10 in which recesses are defined, the light-transmissive members are each disposed in the recesses away from the lateral surfaces defining the recesses.

Step 2-3. Disposing Light-Emitting Element

The light-emitting element is disposed on the light-transmissive member similarly to the method for manufacturing the light-emitting device 100 according to the first embodiment.

Step 2-4. Forming Reflective Member

Figure 9:
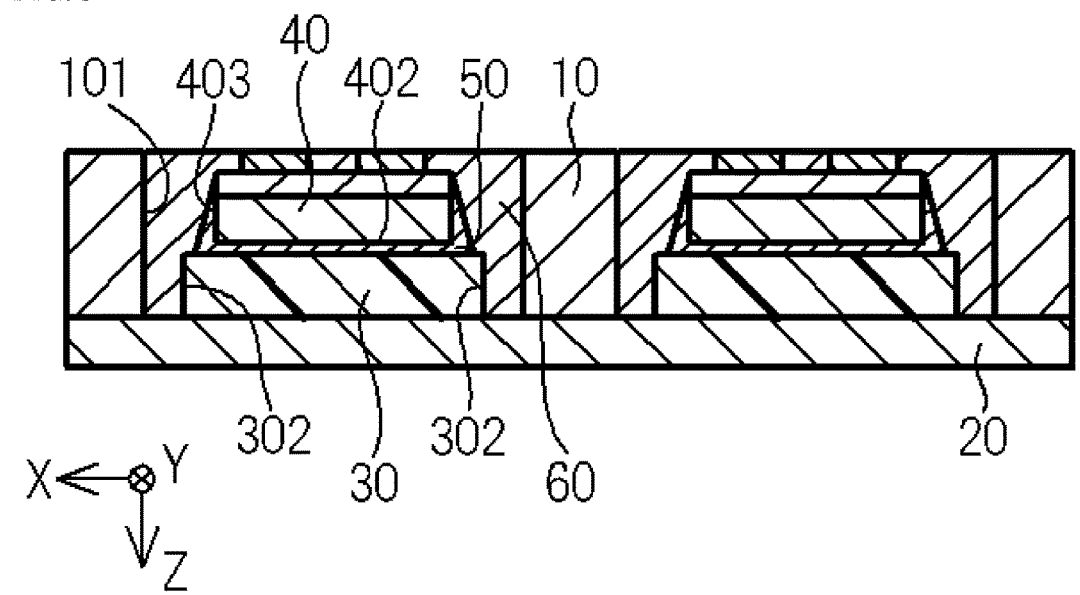
FIG. 9 is a schematic sectional view for illustrating forming of a reflective member according to the second embodiment.

A reflective member 60 is formed so as to be in contact with the lateral surfaces 101 defining the through-hole and cover the lateral surfaces 403 of the light-emitting element 40 as shown in FIG. 9. The reflective member 60 may partially cover the upper surface 301 of the light-transmissive member 30 facing the light-emitting surface 402 of the light-emitting element 40. In the case where the bonding members 50 each bond the light-emitting elements 40 to the light-transmissive members 30, the reflective members 60 may each cover the lateral surfaces 403 interposing the bonding member 50. The light-transmissive member 30 is disposed away from the lateral surfaces 101 defining the through-hole in the method for manufacturing light-emitting devices in the present embodiment, and therefore, the reflective members 60 each cover lateral surfaces 302 of the light-transmissive members 30. In the case where the bonding members 50 each cover the lateral surfaces 302 of the light-transmissive members, the reflective member 60 may each cover the lateral surfaces 302 of the light-transmissive members interposing the bonding members 50.

The thickness (i.e., dimension in the Z direction) of the reflective member 60 may be adjusted such that at least a part of each of the electrodes 43 and 44 is exposed from the reflective member 60 similarly to the method for manufacturing the light-emitting device 100 according to the first embodiment. Alternatively, it is possible that the reflective member 60 having a thickness large enough to embed the electrodes 43 and 44 is formed and then partially removed to expose the electrodes 43 and 44.

In the case of the holding member in which recesses are defined, the reflective members are each formed to be in contact with the lateral surfaces of recesses, and to cover the lateral surfaces of the light-emitting elements. The reflective members also each cover the lateral surfaces of the light-transmissive members.

Step 2-5. Removing Light-Emitting Device

Figure 10A:
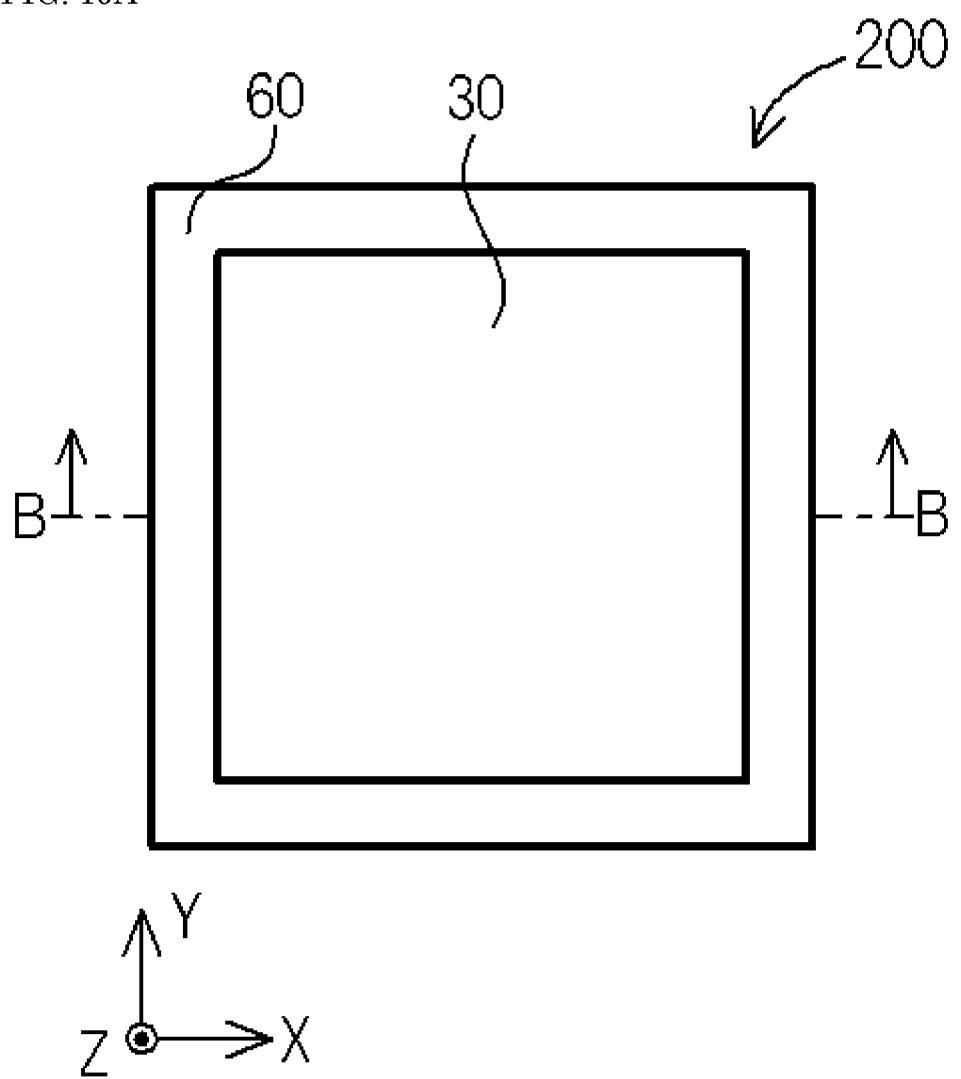
FIG. 10A is a schematic top view of a light-emitting device according to the second embodiment.
Figure 10B:
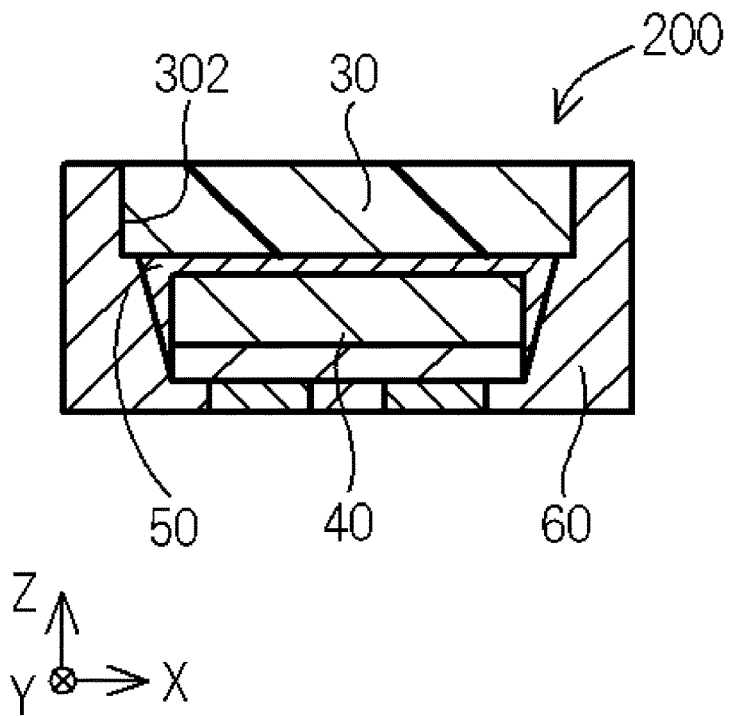
FIG. 10B is a schematic sectional view along the line B-B in FIG. 10A.

By removing light-emitting devices from the holding member similarly to the method for manufacturing the light-emitting devices 100 according to the first embodiment, light-emitting devices 200 shown in FIG. 10A and FIG. 10B can be provided. The reflective members 60 each cover the lateral surfaces 302 of the light-transmissive members 30 in the light-emitting devices 200, and the light distribution of the light-emitting devices 200 can therefore be narrower than the light distribution of the light-emitting devices 100 according to the first embodiment. This structure facilitates, for example, control of light emitted from the light-emitting devices 200 with secondary lenses or the like. The reflective members 60 preferably each cover the peripheries of the light-transmissive members in a top view. This structure allows the light distribution of the light-emitting devices 200 to be narrower. The light-emitting devices are each manufactured in through-holes or recesses of the holding member also in the method for manufacturing a light-emitting device according to the second embodiment, thereby enabling reduction in unevenness of the shape of the light-emitting devices compared with the case where the light-emitting devices are separated by cutting, as described for the first embodiment. Hence, the manufacturing yield of the light-emitting devices is thus improved.

Third Embodiment

A manufacturing process of light-emitting devices according to a third embodiment will be described referring to FIG. 11A to FIG. 14C. The manufacturing process of the light-emitting devices according to the third embodiment differs from the manufacturing process of the light-emitting devices according to the first embodiment in that the wavelength conversion members are each unevenly distributed in the through-holes or recesses of the holding member and that the process includes moving of the light-transmissive members within the through-holes or recesses of the holding member.

Step 3-1. Providing Holding Member

The holding member in which through-holes or recesses are defined, is provided similarly to the method for manufacturing the light-emitting devices 100 according to the first embodiment.

Step 3-2. Disposing Light-Transmissive Member

Figure 11A:
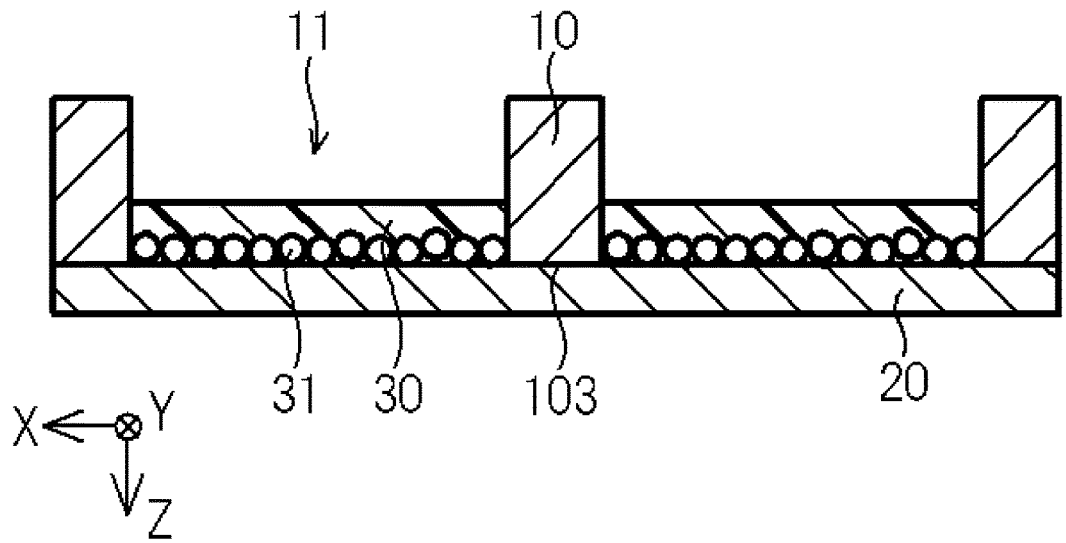
FIG. 11A is a schematic sectional view for illustrating disposing of a light-transmissive member according to a third embodiment.

A light-transmissive members 30 in which wavelength conversion members 31 are unevenly distributed is disposed in each through-hole 11 as shown in FIG. 11A. First, the light-transmissive body containing the wavelength conversion members is filled into the through-holes 11. The wavelength conversion members are dispersed within the light-transmissive body so as to be positioned closer to the supporting member 20. The wavelength conversion members 31 can be disposed closer to the supporting member 20 within the light-transmissive body by, for example, natural or centrifugal sedimentation. The light-transmissive body is cured by heating or the like after the wavelength conversion members are unevenly distributed. The light-transmissive members 30 in which the wavelength conversion members 31 are unevenly distributed is thus disposed in the through-holes 11.

Figure 11B:
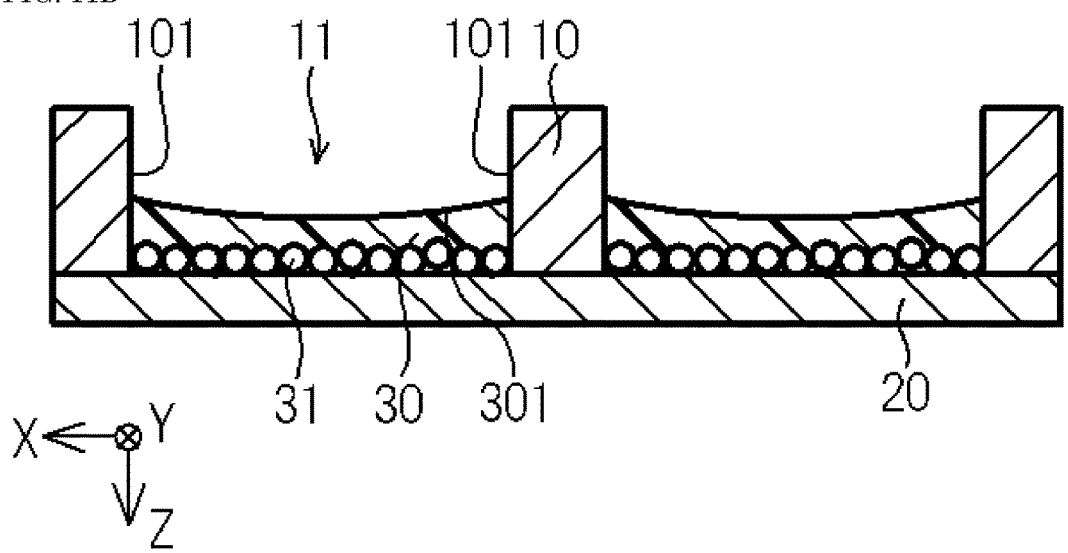
FIG. 11B is a schematic sectional view for illustrating a modification of the disposing of a light-transmissive member according to the third embodiment.
Figure 11C:
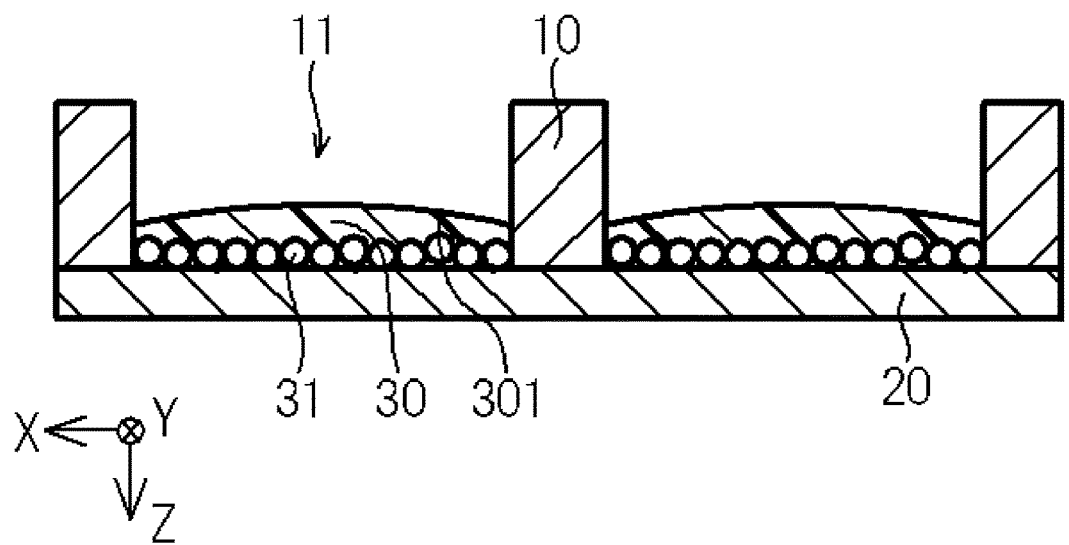
FIG. 11C is a schematic sectional view for illustrating another modification of the disposing of a light-transmissive member according to the third embodiment.

Adjusting the wettability between the light-transmissive body and the holding member can form the upper surfaces of the light-transmissive members each into a concave or convex shape. For example, in the case where the light-transmissive body has a good wettability with respect to the holding member, the upper surfaces of the light-transmissive members can be each formed into a curved concave shapes as shown in FIG. 11B. In the case where the light-transmissive body has a bad wettability with respect to the holding member, the upper surfaces of the light-transmissive members can be each formed into a curved convex shape as shown in FIG. 11C.

In the case where the holding member has recesses, the light-transmissive member in which the wavelength conversion members are unevenly distributed is disposed in each recess. Within the light-transmissive members, the wavelength conversion members are positioned closer to the bottoms of the recesses. The wavelength conversion members can be unevenly distributed in the manner as described above.

Step 3-3. Moving Light-Transmissive Member

In the case of the holding member in which through-holes are defined, a light-transmissive members are each moved from one opening of the holding member on which the light-transmissive members are located, to the other openings of the holding member within each through-hole. In other words, the light-transmissive members are moved from the openings of the holding member that are stopped up by the supporting member to the openings of the holding member that is not stopped up by the supporting member.

Figure 12:
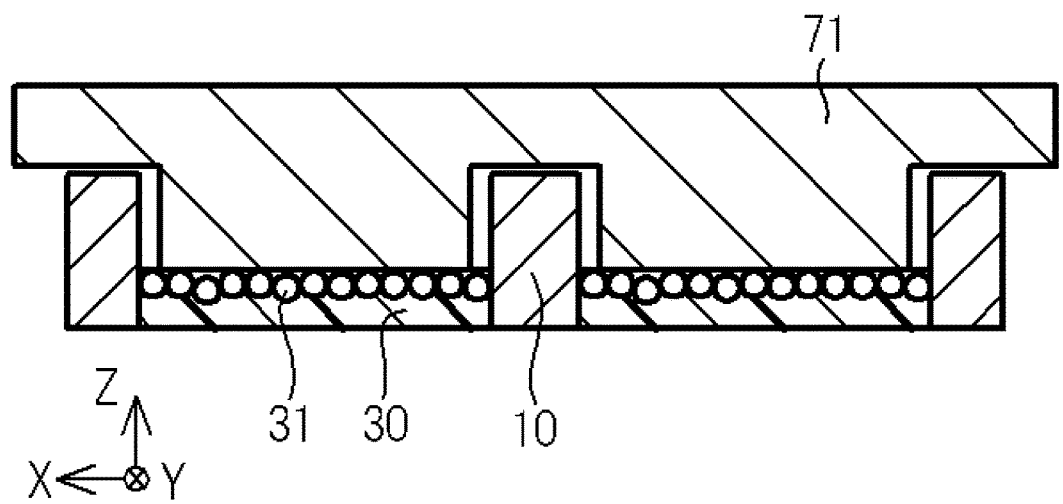
FIG. 12 is a schematic sectional view for illustrating moving of the light-transmissive member according to the third embodiment.

The light-transmissive members are moved by, for example, pushing the light-transmissive members or applying a centrifugal force to the light-transmissive members. The light-transmissive members 30 are preferably each pushed with a pressing member 71 from one opening of the holding member 10 to the other opening of the holding member in the through-hole as shown in FIG. 12. In the case where the light-transmissive members 30 are each pushed with the pressing member 71, the supporting member is preferably removed from the holding member to expose the surfaces of the light-transmissive members to which the wavelength conversion members are localized, and the surfaces of the light-transmissive members to which the wavelength conversion members are not localized from the through-holes of the holding member. This exposure allows the light-transmissive members to be directly each pushed with the pressing member and facilitates moving of the light-transmissive members within the through-holes. By moving the light-transmissive members, spaces between the surfaces of the light-transmissive members to which the wavelength conversion members are localized and the openings of the holding member that are stopped up by the supporting member within the through-holes. Spaces in which the light-emitting elements described later are to be each disposed are thus provided on the surfaces of the light-transmissive members to which the wavelength conversion members are localized within the through-holes.

In the case of the holding member in which recesses are defined, the light-transmissive members can be moved from the bottom side of the each recess to the open side of the each recess by, for example, applying a centrifugal force to the light-transmissive members. Alternatively, the bottom of the holding member can be removed to make the recesses of the holding member into through-holes. This removal allows the light-emitting elements to be disposed through the openings of the through-hole formed by removal of the bottom. The light-transmissive members may be moved after making the recesses of the holding member into through-holes by removing the bottom of the holding member. This procedure allows the light-transmissive members to be each moved from one opening of the holding member on which the light-transmissive member is located to the other opening of the holding member within the through-hole in the manner described above.

Step 3-4. Disposing Light-Emitting Element

Figure 13:
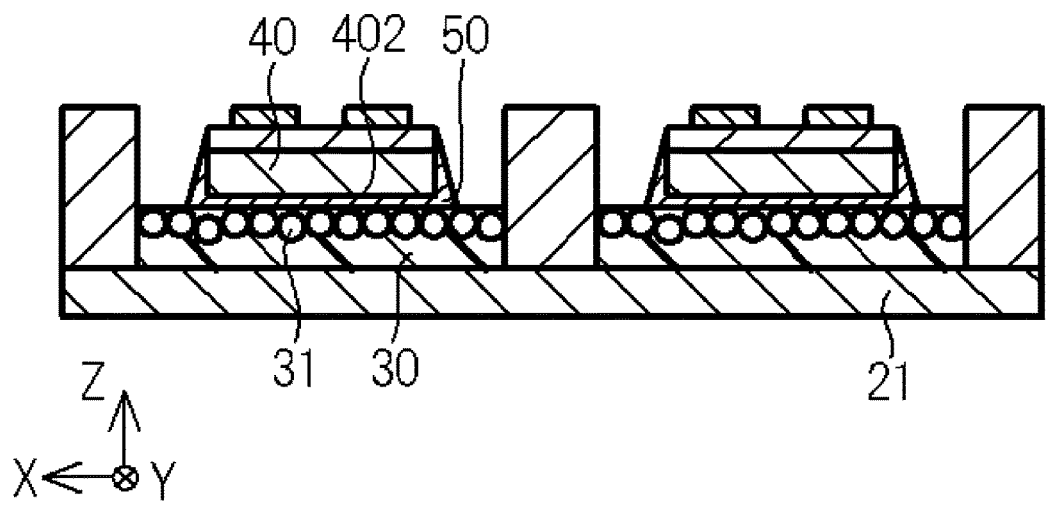
FIG. 13 is a schematic sectional view for illustrating disposing of a light-emitting element according to the third embodiment.

The light-emitting elements 40 are each disposed on the surface of the light-transmissive member 30 to which the wavelength conversion members 31 are localized as shown in FIG. 13. The light-emitting elements 40 may respectively be bonded to the light-transmissive members 30 with the bonding members 50 having light-transmissivity. The light-transmissive members 30 are each supported by a supporting member 21 facing the surface to which the wavelength conversion members 31 are not localized. The light-emitting element are respectively disposed on/above the light-transmissive members such that the light-emitting surfaces 402 of the light-emitting elements 40 respectively face the light-transmissive members 30 identically or similarly to the method for manufacturing the light-emitting devices 100 according to the first embodiment.

Step 3-5. Forming Reflective Member

The reflective members respectively covering the lateral surfaces of the light-emitting elements are formed identically or similarly to the method for manufacturing the light-emitting devices 100 according to the first embodiment.

Step 3-5. Removing Light-Emitting Device

Figure 14A:
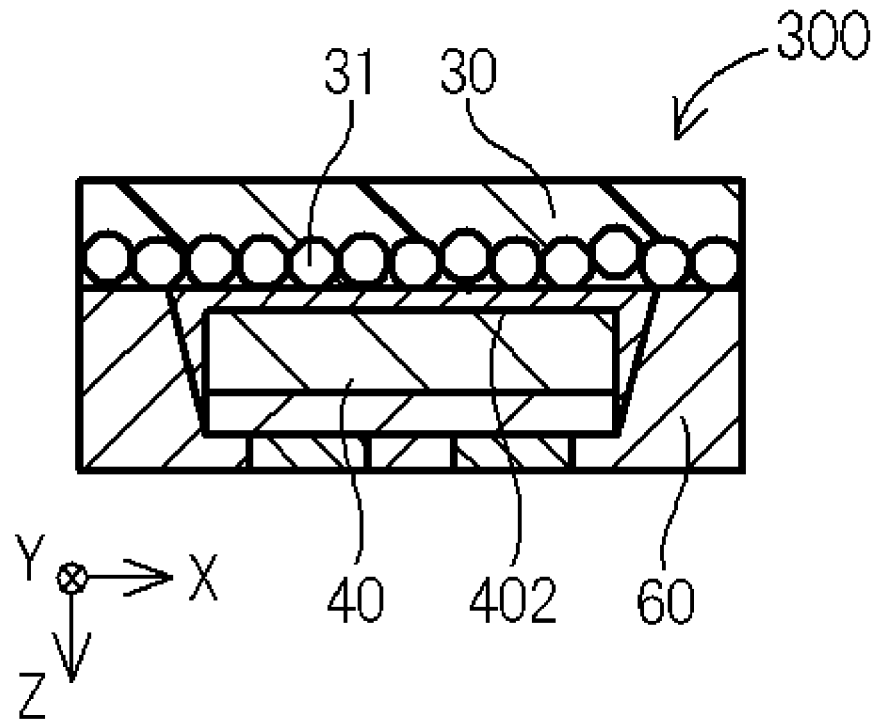
FIG. 14A is a schematic sectional view of a light-emitting device according to the third embodiment.

By removing light-emitting devices from the holding member identically or similarly to the method for manufacturing the light-emitting devices 100 according to the first embodiment, light-emitting devices 300 shown in FIG. 14A can be obtained. Light-emitting devices are manufactured in each through-hole or recess of the holding member also in the method for manufacturing light-emitting devices according to the third embodiment, unevenness in the shape of the light-emitting devices is reduced compared with the case where the light-emitting devices are separated by cutting, as described for the first embodiment. The yield of the light-emitting devices are thus improved. In the light-emitting devices 300, the light-emitting surfaces 402 of the light-emitting elements respectively face the surfaces of the light-transmissive members 30 to which the wavelength conversion members 31 are localized. This structure inhibits or prevents deterioration of the wavelength conversion members even when the wavelength conversion members used are not resistant to moisture, thereby enabling maintenance of good chromaticity.

Figure 14B:
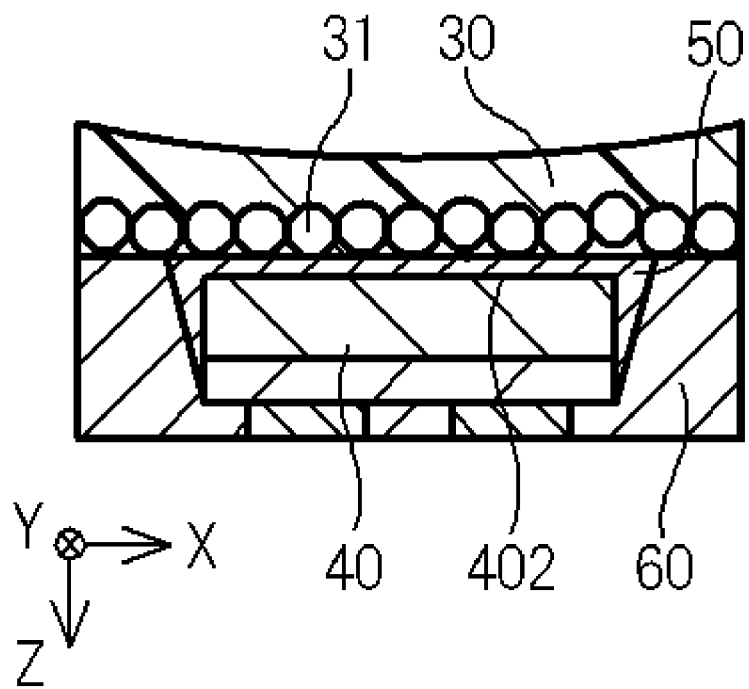
FIG. 14B is a schematic sectional view of a modification of the light-emitting device according to the third embodiment.

In the case where the above-mentioned manufacturing process of light-emitting devices is performed using the light-transmissive members shown in FIG. 11B, the surfaces of the light-transmissive members each constituting the upper surface of the light-emitting device has a curved concave shape as shown in FIG. 14B. This structure reduces tackiness of the surface of the light-transmissive members each containing a resin material compared with the case where the surfaces of the light-transmissive members each constituting the upper surface of the light-emitting device is flat. Handling of the light-emitting devices is thus improved. Further, this structure promotes reflection of light emitted from the light-emitting elements on the interface between the light-transmissive members and air, thereby facilitating diffusion of light emitted from the light-emitting elements within the light-transmissive members. This diffusion reduces non-uniform luminance within the light-transmissive member.

In the case where the above-mentioned manufacturing process of light-emitting devices is performed using the light-transmissive members shown in FIG. 11C, the surfaces of the light-transmissive members each constituting the upper surface of the light-emitting device has a curved convex shape as shown in FIG. 14C. This structure reduces tackiness of the surfaces of light-transmissive members each containing a resin material compared with the case where the surfaces of the light-transmissive members each constituting the upper surface of the light-emitting device is flat. Handling of the light-emitting devices is thus improved. Further, this structure reduces reflection of light emitted from the light-emitting element on the interface between the light-transmissive members and air, thereby improving the light extraction efficiency of the light-emitting devices.

Fourth Embodiment

A manufacturing process of light-emitting devices according to a fourth embodiment will be described referring to FIG. 15 to FIG. 17D. The manufacturing process of the light-emitting devices according to the fourth embodiment differs from the manufacturing process of the light-emitting devices according to the first embodiment in that the light-transmissive member faces a lateral surface of the light-emitting element.

Step 4-1. Providing Holding Member

The holding member in which through-holes or recesses are defined is provided identically or similarly to the method for manufacturing the light-emitting devices 100 according to the first embodiment.

Step 4-2. Disposing Light-Transmissive Member

A light-transmissive members are each disposed in through-hole or recess identically or similarly to the method for manufacturing the light-emitting devices 100 according to the first embodiment. The same or similar light-transmissive member to that in the method for manufacturing the light-emitting devices 200 according to the second embodiment or the method for manufacturing the light-emitting devices 300 according to the third embodiment may be disposed in the through-hole or recess. As the method for manufacturing the light-emitting devices 300 according to the third embodiment, moving of the light-transmissive members may be included.

Step 4-3. Disposing Light-Emitting Element

Figure 15:
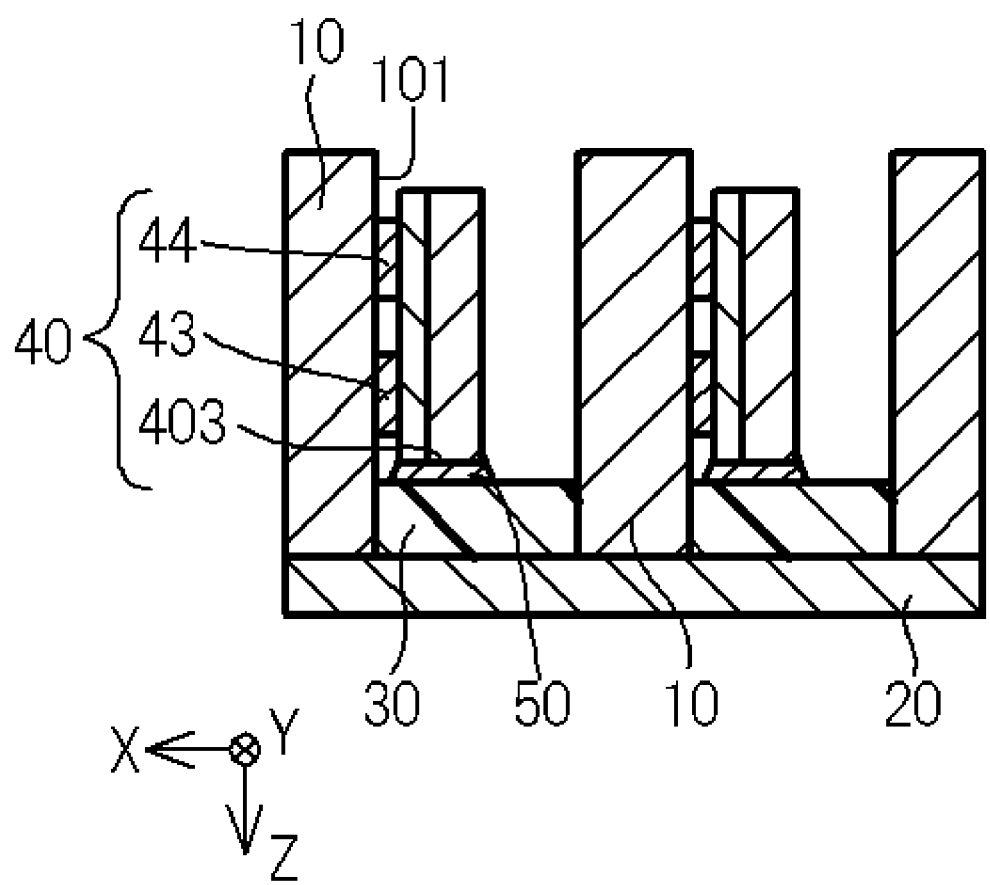
FIG. 15 is a schematic sectional view for illustrating disposing of a light-emitting element according to a fourth embodiment.

A light-emitting elements 40 are each disposed on the light-transmissive member 30 such that the light-transmissive members 30 each face one lateral surface 403 of the light-emitting element 40 within each of the through-holes as shown in FIG. 15. The light-emitting elements 40 may each be bonded to the light-transmissive member 30 with the light-transmissive bonding member 50. The light-emitting elements are each disposed preferably such that the electrodes 43 and 44 of each of the light-emitting elements are in contact with a lateral surface 101 defining the through-hole. This structure facilitates exposure of the electrodes 43 and 44 of the light-emitting elements from the reflective members described later.

In the case where the holding member has recesses, the light-emitting element is disposed on the light-transmissive member so that the light-transmissive member faces a lateral surface of the light-emitting element within each recess.

Step 4-4. Forming Reflective Member

Figure 16:
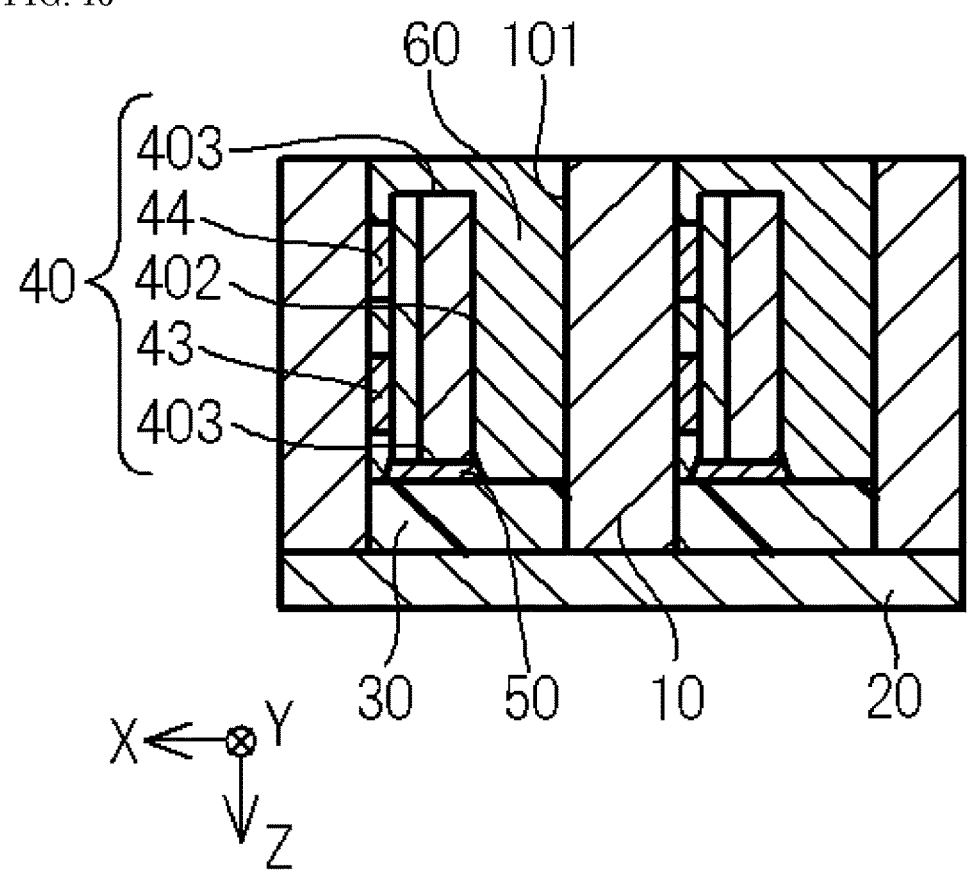
FIG. 16 is a schematic sectional view for illustrating forming of a reflective member according to the fourth embodiment.

A reflective members 60 are each formed to be in contact with the lateral surfaces defining the through-hole and cover the other lateral surface 403 of the light-emitting element 40 as shown in FIG. 16. In the method for manufacturing a light-emitting devices in the present embodiment, the reflective member 60 also covers the light-emitting surface 402 of the light-emitting element. At least a part of each of the electrodes 43 and 44 is exposed from the reflective member 60. By virtue of the electrodes 43 and 44 both being contact with the lateral surface 101 of the through-hole facilitates exposure of the electrodes 43 and 44 of the light-emitting element from the reflective member. Alternatively, a reflective members 60 may also each be formed to embed the electrodes 43 and 44, and then partially removed to expose at least a part of the electrodes 43 and 44. In the case where part of each of the reflective members 60 is removed, the part of each of the reflective members 60 is removed after the light-emitting devices are removed from the holding member. The reflective members 60 can be removed in a same or similar manner to the above-described manner.

In the case of the holding member in which recesses are defined, the reflective members are formed to be each in contact with the lateral surfaces defining recess and covers the lateral surfaces and light-emitting surface of the light-emitting element. At least a part of each of the electrodes is exposed from the reflective member.

Step 4-5. Removing Light-Emitting Device

The light-emitting devices each including the light-transmissive member, the light-emitting element, and the reflective member are removed from the through-holes of the holding member. The light-emitting devices can be removed identically or similarly to the method for manufacturing the light-emitting devices 100 according to the first embodiment.

Figure 17A:
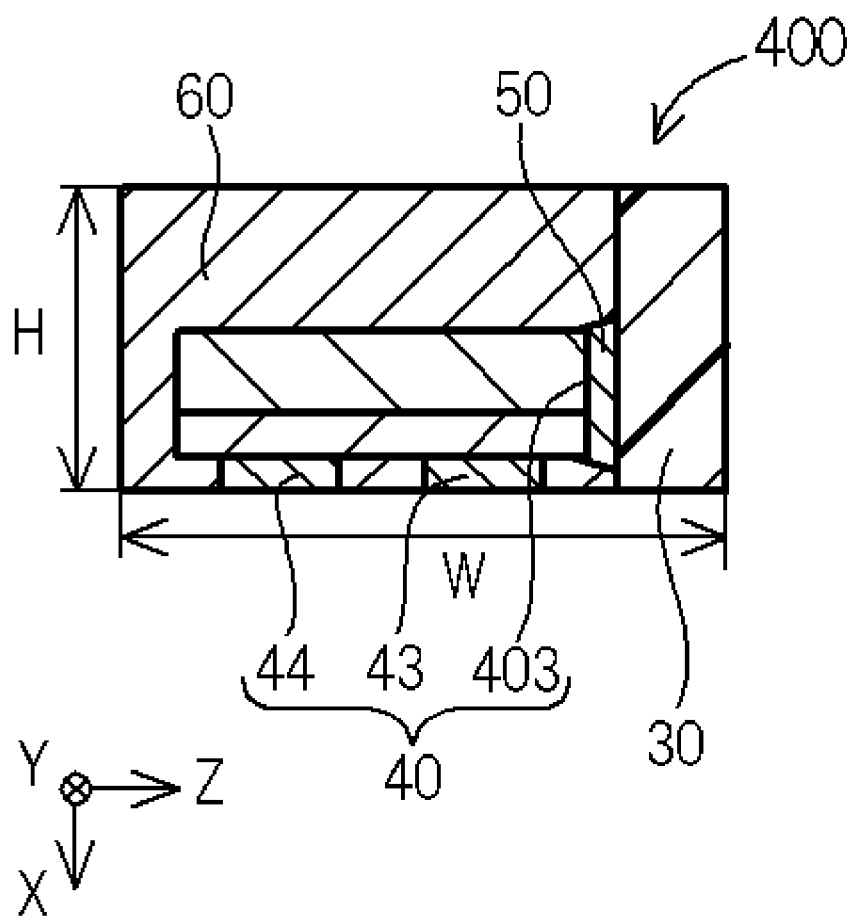
FIG. 17A is a schematic sectional view of a light-emitting device according to the fourth embodiment.

The light-emitting devices in the fourth embodiment that emit light mainly from the direction of the lateral surface 403 of the light-emitting element are provided as shown in FIG. 17A through the above-mentioned steps. Each of the light-emitting devices is manufactured in each of the through-holes or recesses defined in the holding member also in the method for manufacturing light-emitting devices according to the fourth embodiment, unevenness in the shape of the light-emitting devices is reduced compared with the case where the light-emitting devices are separated by cutting, as described for the first embodiment. The yield of the light-emitting device is thus improved.

Figure 17D:
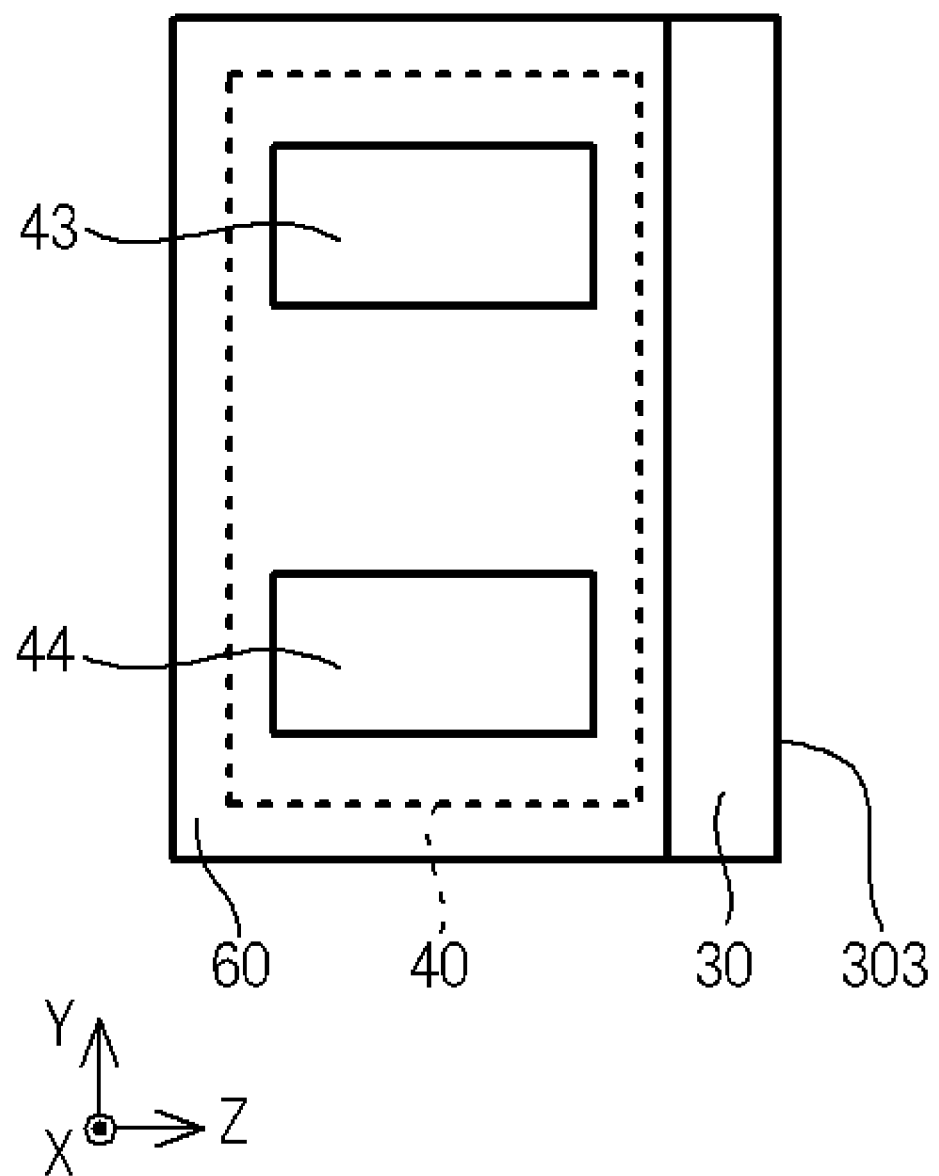
FIG. 17D is a schematic bottom view of another modification of the light-emitting device according to the fourth embodiment.

A thickness H (i.e., X direction) of each of the light-emitting devices 400 is preferably smaller than a width W (i.e., Z direction) of thereof. This structure allows the light-emitting devices 400 to be slim. The pair of electrodes 43 and 44 of the light-emitting element and the light-transmissive members 30 in one light emitting device may be aligned in a row as shown in FIG. 17B. Alternatively, the pair of electrodes 43 and 44 of the light-emitting element in one light emitting device may be aligned substantially perpendicularly to a light-extracting surface 303 of the light-transmissive member 30 as shown in FIG. 17C. It is preferable that the light-emitting element 40 have a substantially rectangular shape and that the longitudinal direction of the light-emitting element be substantially parallel to the light-extracting surface 303 of the light-transmissive member 30 as shown in FIG. 17D. This structure allows light traveling in the longitudinal direction of the light-emitting element readily extracting from the light-emitting device.

The following describes materials suitable for constituent members in the methods for manufacturing a light-emitting device in the first to fourth embodiments.

Holding Member 10

The holding member 10 in which through-holes or recesses in each of which the light-emitting device is manufactured. Examples of the material of the holding member 10 include metals and resins. In the case where the holding member is not to be processed, a metal is preferably used as the material of the holding member 10. The holding member comprising a metal is less likely to be deteriorated compared to a resin, and therefore can be used repeatedly. In the case where the holding member 10 is processed, a resin is preferably used as the material of the holding member 10. Use of a resin as the material of the holding member 10 makes the processing easier compared to the case of using a metal.

Supporting Members 20 and 21

The supporting member closes the through-holes of the holding member. The supporting member preferably comprises a heat-resistant sheet because heat is generated in disposing of the light-emitting element. The supporting member may be a sheet on one face of which an adhesive is applied or a sheet whose adhesiveness can be lost by exposure to UV light.

Light-Transmissive Member 30

The light-transmissive members 30 protects the light-emitting element against external environments. Examples of the material of the light-transmissive member include light-transmissive resin materials and glass materials. Examples of the resin materials for the light-transmissive member include thermosetting resins, such as silicone resins, modified silicone resins, epoxy resins, and phenolic resins, and thermoplastic resins, such as polycarbonate resins, acrylic resins, methylpentene resin, and polynorbornene resin. A silicone resin is particularly suitable due to the good resistance to light and heat. A preferable light-transmissive resin has a high transmittance of light. The thickness of the light-transmissive member is preferably 10 μm to 500 μm, more preferably 50 μm to 300 μm.

Wavelength Conversion Member 31

The light-transmissive member may contain the wavelength conversion members 31. The wavelength conversion members 31 are particles that convert a peak wavelength of light emitted from the light-emitting element into a different peak wavelength. For the wavelength conversion members 31, one or more phosphors that can be excited by light emitted from the light-emitting element can be used. Examples of phosphors that can be excited by a blue or ultraviolet light-emitting element include cerium-activated yttrium-aluminum-garnet phosphors (YAG:Ce); cerium-activated lutetium-aluminum-garnet phosphors (LAG:Ce); europium- and/or chromium-activated nitrogen-containing calcium aluminosilicate phosphors ($CaO.Al_2O_3.SiO_2$:Eu, Cr); europium-activated silicate phosphors (($Sr,Ba)_2SiO_4$: Eu); nitride phosphors, such as β-SiAlON phosphors, CASN phosphors, and SCASN phosphors; fluoride phosphors, such as KSF phosphors; sulfide phosphors; chloride phosphors; silicate phosphors; and phosphate phosphors. Combinations of such phosphors and blue or ultraviolet light-emitting elements realize various wavelengths of light-emitting devices to be manufactured.

Light-Diffusing Member

The light-transmissive member may contain light-diffusing members to improve non-uniformity in luminance and color. Examples of the material of the light-diffusing members include titanium oxide, zirconium oxide, aluminum oxide, and silicon oxide. Titanium oxide is particularly preferable because titanium oxide is comparatively stable to moisture and the like and has a high refractive index.

Light-Emitting Element 40

For the light-emitting element 40, a known semiconductor element comprising a nitride semiconductor or the like can be used. The emission wavelength of the light-emitting element can be selected from the ultraviolet range in addition to the visible range (380 nm to 780 nm). For example, a nitride semiconductor can be used as a light-emitting element having a peak wavelength of 430 nm to 490 nm. Examples of the nitride semiconductor include $In_xAl_yGa_{1-x-y}N$ (0≤X, 0≤Y, X+Y≤1). The light-emitting element includes the light-transmissive substrate 41, the semiconductor layered body 42, and the electrodes 43 and 44. For example, a light-transmissive insulating material, such as sapphire, can be used for the light-transmissive substrate of the light-emitting element.

Bonding Member 50

The bonding member bonds the light-emitting element and the light-transmissive member. The bonding member can comprise a light-transmissive resin. The light-transmissive resin is particularly preferably a light-transmissive thermosetting resin, such as silicone resins, modified silicone resins, epoxy resins, and phenolic resins. The bonding member is in contact with the light-emitting element, and therefore easily affected by heat generated by the light-emitting element while the light-emitting element is turned on. Thermosetting resins are suitable for the bonding member from the standpoint of having good heat resistant. The bonding member preferably has a high transmittance for light emitted from the light-emitting element.

Reflective Member 60

The reflective member reflects light emitted from the light-emitting element. The reflective member can comprise a light-reflective resin. A light-reflective resin refers to a resin that has 70% or more of reflectance with respect to the peak wavelength of the light-emitting element. For the light-reflective resin, a light-transmissive resin in which a light-reflective substance is dispersed can be used. Examples of the light-reflective substance include titanium oxide, aluminum oxide, zirconium oxide, and magnesium oxide. Particles of the light-reflective substance can be a granular, fibrous, or flaky shape, for example. The resin material contained in the light-reflective resin is preferably a light-transmissive thermosetting resin, such as silicone resins, modified silicone resins, epoxy resins, and phenolic resins. It is preferable to use a silicone resin from the standpoint of having good resistance to light and heat.

Light emitting devices manufactured by the embodiments of the present disclosure can be used for various applications, such as interior lighting, exterior lighting, various indicators, displays, backlights for liquid crystal screens, sensors, signals, vehicle components, and channel letters for signage.

What is claimed is:

1. A method for manufacturing at least one light-emitting device comprising a light-transmissive member, a light-emitting element, and a reflective member, the method comprising:
    providing a holding member comprising a plurality of through-holes or recesses;
    disposing a light-transmissive member in at least one of the through-holes or at least one of the recesses;
    disposing a light-emitting element on the light-transmissive member in the at least one through-hole or the at least one recess;
    forming a reflective member in contact with a lateral surface defining the at least one through-hole or the at least one recess and covering a lateral surface of the light-emitting element; and
    removing the at least one light-emitting device from the holding member.

2. The method according to claim 1, wherein:
    the light-emitting element of each light emitting device comprises a pair of electrodes at a surface opposite to a surface facing the light-transmissive member, and
    the step of forming the reflective member comprises:
        forming the reflective member such that the pair of electrodes are embedded in the reflective member; and
        subsequently, removing part of the reflective member to expose at least a part of each of the pair of electrodes.

3. The method according to claim 1, wherein:
    in the step of removing the at least one light-emitting device, the at least one light-emitting device is removed from the holding member by pushing the light-emitting element and/or the reflective member.

4. The method according to claim 1, wherein:
    in the step of disposing the light-emitting element, the light-emitting element is disposed on the light-transmissive member with a bonding member therebetween.

5. The method according to claim 4, wherein:
    in the at least one light emitting device, the bonding member is in contact with the lateral surface of the light-emitting element.

6. The method according to claim 4, wherein:
    in the at least one light emitting device, the reflective member is in contact with the bonding member.

7. The method for according to claim 1, wherein:
    in the at least one light emitting device, a hardness of the reflective member is higher than a hardness of the light-transmissive member.

8. The method according to claim 1, wherein:
    in the at least one light emitting device, the light-transmissive member contains wavelength conversion members.

9. The method according to claim 8, wherein:
    in each light emitting device, the wavelength conversion members contained in the light transmissive member are unevenly distributed.

10. The method according to claim 9, wherein:
    in the at least one light emitting device, the wavelength conversion members contained in the light-transmissive member are localized to a surface facing the light-emitting element.

11. A method for manufacturing a plurality of light-emitting devices, each comprising a light-transmissive member, a light-emitting element, and a reflective member, the method comprising:
    providing a holding member comprising a plurality of through-holes or recesses;
    disposing a light-transmissive member in each of the through-holes or recesses;
    disposing a light-emitting element on the light-transmissive member in each of the through-hole or recesses;
    forming a reflective member in contact with a lateral surface defining each of the through-holes or recesses and covering a lateral surface of a respective one of the light-emitting elements; and
    removing the light-emitting devices from the holding member.

12. The method according to claim 11, wherein:
    the light-emitting element of each light emitting device comprises a pair of electrodes at a surface opposite to a surface facing the corresponding light-transmissive member, and
    the step of forming the reflective member comprises:
        forming the reflective member such that the respective pair of electrodes are embedded in the reflective member; and
        subsequently, removing part of the reflective member to expose at least a part of each of the respective pair of electrodes.

13. The method according to claim 11, wherein:
    in the step of removing the light-emitting devices, the light-emitting devices are removed from the holding member by pushing the light-emitting elements and/or the reflective members.

14. The method according to claim 11, wherein:
    in the step of disposing the light-emitting element, each light-emitting element is disposed on a respective light-transmissive member with a bonding member therebetween.

15. The method according to claim 14, wherein:
    in each light emitting device, the bonding member is in contact with the lateral surface of the light-emitting element.

16. The method according to claim 14, wherein:
    in each light emitting device, the reflective member is in contact with the bonding member.

17. The method for according to claim 11, wherein:
    in each light emitting device, a hardness of the reflective member is higher than a hardness of the light-transmissive member.

18. The method according to claim 11, wherein:
    in each light emitting device, the light-transmissive member contains wavelength conversion members.

19. The method according to claim 18, wherein:
    in each light emitting device, the wavelength conversion members contained in the light transmissive member are unevenly distributed.

20. The method according to claim 19, wherein:
    in each light emitting device, the wavelength conversion members contained in the light-transmissive member are localized to a surface facing the light-emitting element.

* * * * *